US008354694B2

(12) United States Patent
Bedell et al.

(10) Patent No.: US 8,354,694 B2
(45) Date of Patent: Jan. 15, 2013

(54) CMOS TRANSISTORS WITH STRESSED HIGH MOBILITY CHANNELS

(75) Inventors: Stephen W. Bedell, Wappingers Falls, NY (US); Jee H. Kim, Los Angeles, CA (US); Siegfried L. Maurer, Stormville, NY (US); Alexander Reznicek, Mount Kisco, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 12/855,738

(22) Filed: Aug. 13, 2010

(65) Prior Publication Data

US 2012/0037998 A1 Feb. 16, 2012

(51) Int. Cl.
*H01L 29/66* (2006.01)
(52) U.S. Cl. ........................ 257/192; 257/342
(58) Field of Classification Search .................. 257/192, 257/347
See application file for complete search history.

(56) References Cited

U.S. PATENT DOCUMENTS

| 7,205,586 B2 * | 4/2007 | Takagi et al. ................. 257/192 |
| 2007/0187716 A1 | 8/2007 | Chu |
| 2008/0138964 A1 | 6/2008 | Ye et al. |

OTHER PUBLICATIONS

Wang, G.H. et al., "Strained Silicon-Germanium-On-Insulator n-MOSFET with Embedded Silicon Source-and-Drain Stressors" IEEE Electron Device Letters (2008) pp. 77-79, vol. 29(1).

\* cited by examiner

*Primary Examiner* — Howard Weiss
*Assistant Examiner* — Steven Rao
(74) *Attorney, Agent, or Firm* — Scully, Scott, Murphy & Presser, P.C.; Louis J. Percello, Esq.

(57) ABSTRACT

A p-type field effect transistor (PFET) having a compressively stressed channel and an n-type field effect transistor (NFET) having a tensilely stressed channel are formed. In one embodiment, a silicon-germanium alloy is employed as a device layer, and the source and drain regions of the PFET are formed employing embedded germanium-containing regions, and source and drain regions of the NFET are formed employing embedded silicon-containing regions. In another embodiment, a germanium layer is employed as a device layer, and the source and drain regions of the PFET are formed by implanting a Group IIIA element having an atomic radius greater than the atomic radius of germanium into portions of the germanium layer, and source and drain regions of the NFET are formed employing embedded silicon-germanium alloy regions. The compressive stress and the tensile stress enhance the mobility of charge carriers in the PFET and the NFET, respectively.

25 Claims, 24 Drawing Sheets

CMOS TRANSISTORS WITH STRESSED HIGH MOBILITY CHANNELS

BACKGROUND

The present disclosure generally relates to semiconductor devices, and particularly to complementary metal-oxide-semiconductor (CMOS) field effect transistors including a p-type field effect transistor (PFET) having a compressively stressed channel and an n-type field effect transistor (NFET) having a tensilely stressed channel, and methods of manufacturing the same.

Carrier mobility in a metal oxide semiconductor field effect transistor (MOSFET) may be manipulated by a stress applied to the channel of the MOSFET. Even relatively small changes in the stress of the channel may result in large changes in carrier mobility for some combinations of semiconductor material and crystallographic orientations, and may be utilized to increase the transconductance (or reduced serial resistance) of the MOSFET, thereby enhancing the performance of the MOSFET.

When stress is applied to the channel of a semiconductor transistor, the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress. Under stress applied the channel of the MOSFET, the mobility of carriers, and as a consequence, the transconductance and the on-current of the transistor are altered from their original values for an unstressed semiconductor.

The effect of uniaxial stress, i.e., a stress applied along one crystallographic orientation, on the performance of semiconductor devices has been extensively studied in the semiconductor industry. For a p-type MOSFET, i.e., a PMOSFET (or a "PFET" in short) that utilizes a silicon channel or silicon-germanium alloy channel, the mobility of minority carriers in the channel (which are holes in this case) increases under longitudinal compressive stress along the direction of the channel, i.e., the direction of the movement of holes or the direction connecting the drain to the source. Conversely, for an n-type MOSFET, i.e., an NMOSFET (or an "NFET" in short) that utilizes a silicon channel or a silicon-germanium alloy channel, the mobility of minority carriers in the channel (which are electrons in this case) increases under longitudinal tensile stress along the direction of the channel, i.e., the direction of the movement of electrons or the direction connecting the drain to the source.

While such beneficial effects of stress are known in the art, a difficulty arises since two different types of field effect transistors require two different types of stress. Specifically, a longitudinal compressive stress is required or a PMOSFET, and a longitudinal tensile stress is required for an NMOSFET.

BRIEF SUMMARY

In one embodiment, a p-type field effect transistor (PFET) and an n-type field effect transistor (NFET) are formed in a silicon-germanium alloy layer. Source and drain regions of the PFET are formed employing embedded germanium-containing regions, and source and drain regions of the NFET are formed employing embedded silicon-containing regions. The embedded germanium-containing regions apply a compressive stress to the channel of the PFET, and the embedded silicon-containing regions apply a tensile stress to the channel of the NFET. The compressive stress and the tensile stress enhance the mobility of charge carriers in the PFET and the NFET, respectively.

In another embodiment, a p-type field effect transistor (PFET) and an n-type field effect transistor (NFET) are formed in a germanium layer. Source and drain regions of the PFET are formed by implanting a Group IIIA element having an atomic radius greater than the atomic radius of germanium into portions of the germanium layer, and source and drain regions of the NFET are formed employing embedded silicon-germanium alloy regions. The Group IIIA element-containing source and drain regions apply a compressive stress to the channel of the PFET, and the embedded silicon-germanium alloy regions apply a tensile stress to the channel of the NFET. The compressive stress and the tensile stress enhance the mobility of charge carriers in the PFET and the NFET, respectively.

According to an aspect of the present disclosure, a semiconductor structure is provided, which includes: a p-type field effect transistor (PFET) located on a silicon-germanium alloy layer in a substrate and including a germanium-containing source region and a germanium-containing drain region, wherein the silicon-germanium alloy layer includes silicon at a greater atomic concentration than the germanium-containing source region and the germanium-containing drain region; and an n-type field effect transistor (NFET) located on the silicon-germanium alloy layer in the substrate and including a silicon-containing source region and a silicon-containing drain region, wherein the silicon-germanium alloy layer includes germanium at a greater atomic concentration than the silicon-containing source region and the silicon-containing drain region.

According to another aspect of the present disclosure, another semiconductor structure is provided, which includes: a p-type field effect transistor (PFET) located on a germanium layer in a substrate and including a p-doped source region and a p-doped drain region that are doped with a Group IIIA element having an atomic radius greater than an atomic radius of germanium; and an n-type field effect transistor (NFET) located on the germanium layer in the substrate and including a silicon-containing source region and a silicon-containing drain region.

According to yet another aspect of the present disclosure, a method of forming a semiconductor structure is provided, which includes: forming a germanium-containing source region and a germanium-containing drain region in an n-doped portion of a silicon-germanium alloy layer in a substrate, wherein the silicon-germanium alloy layer includes silicon at a greater atomic concentration than the germanium-containing source region and the germanium-containing drain region; and forming a silicon-containing source region and a silicon-containing drain region in a p-doped portion of the silicon-germanium alloy layer in the substrate, wherein the silicon-germanium alloy layer includes germanium at a greater atomic concentration than the silicon-containing source region and the silicon-containing drain region.

According to still another aspect of the present disclosure, a method of forming a semiconductor structure is provided, which includes: forming a p-doped source region and a p-doped drain region that are doped with a Group IIIA element having an atomic radius greater than an atomic radius of germanium in an n-doped portion of a germanium layer in a substrate; and forming a silicon-containing source region and a silicon-containing drain region in a p-doped portion of the germanium layer in the substrate.

DETAILED DESCRIPTION

Figure 1:
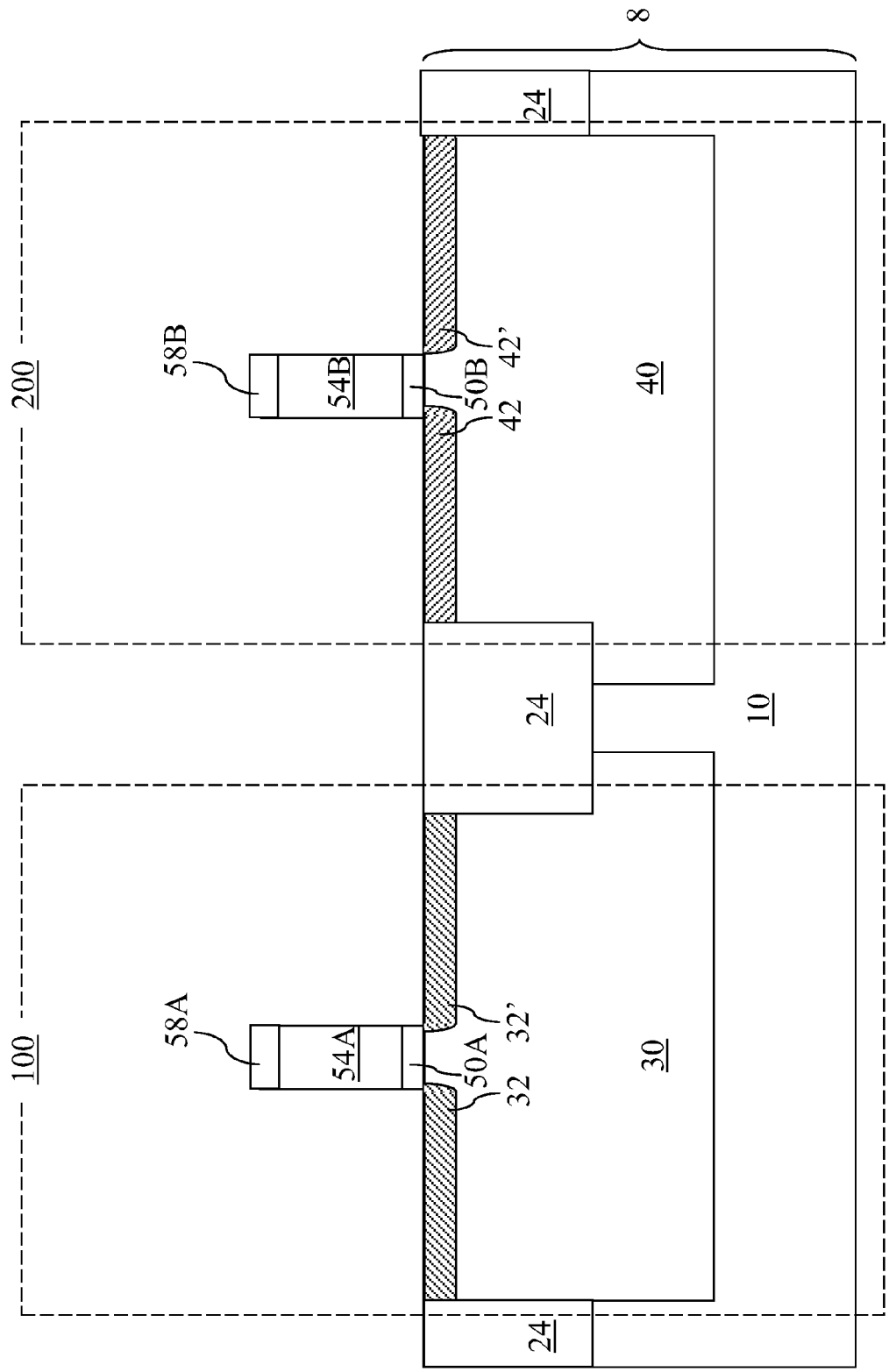
FIGS. 1-9 are sequential vertical cross-sectional views of a first exemplary semiconductor structure according to a first embodiment of the present disclosure at various stages of a manufacturing process.

As stated above, the present disclosure relates to complementary metal-oxide-semiconductor (CMOS) field effect transistors including a p-type field effect transistor (PFET) having a compressively stressed channel and an n-type field effect transistor (NFET) having a tensilely stressed channel, and methods of manufacturing the same, which are now described in detail with accompanying figures. It is noted that like reference numerals refer to like elements across different embodiments. The drawings are not necessarily drawn to scale. The drawings are not necessarily drawn to scale.

As used herein, a "silicon-containing" element includes silicon, and may, or may not, include any other atomic element.

As used herein, a "germanium-containing" element includes germanium, and may, or may not, include any other atomic element.

As used herein, a "p-type dopant" is a dopant selected from B, Al, Ga, In, and Tl.

As used herein, an "n-type dopant" is a dopant selected from P, As, and Sb.

As used herein, a "silicon layer" is a layer consisting of silicon, an alloy of silicon and at least one p-type dopant, an alloy of silicon and at least one n-type dopant, or an alloy of silicon and at least one p-type dopant and at least one n-type dopant.

As used herein, a "germanium layer" is a layer consisting of germanium, an alloy of germanium and at least one p-type dopant, an alloy of germanium and at least one n-type dopant, or an alloy of germanium and at least one p-type dopant and at least one n-type dopant.

As used herein, a "silicon-germanium alloy" is an alloy of silicon, germanium, and optionally at least one p-type dopant and/or at least one n-type dopant.

As used herein, a "silicon-to-germanium ratio" is the ratio of the density of silicon atoms to the density of germanium atoms in a material including at least one of silicon and germanium. The silicon-to-germanium ratio can range from zero to infinity.

Referring to FIG. 1, a first exemplary semiconductor structure according to a first embodiment of the present disclosure includes a substrate 8. The substrate 8 includes a silicon-germanium alloy layer, which can include an underlying silicon-germanium alloy layer 10, a p-doped silicon-germanium alloy region 30 that is an n-doped portion of the silicon-germanium alloy layer, and an n-doped silicon-germanium alloy region 40 that is a p-doped portion of the silicon-germanium alloy layer. The p-doped silicon-germanium alloy region 30 can function as a p-type well, and the n-doped silicon-germanium alloy region 40 can function as an n-type well. The underlying silicon-germanium alloy layer 10 may be intrinsic, p-doped, or n-doped. The silicon-germanium alloy layer (10, 30, 40) can have an atomic germanium concentration from 1.0% to 99.0%, and typically from 10% to 90%, and more typically from 25% to 75%. The silicon-to-germanium ratio is constant throughout the silicon-germanium alloy layer (10, 30, 40). The silicon-germanium alloy layer (10, 30, 40) can consist of silicon, germanium, and p-type or n-type dopants.

The substrate 8 can be a bulk substrate including the silicon-germanium alloy layer (10, 30, 40) at the top portion thereof. Alternately, the substrate 8 can be a semiconductor-on-insulator (SOI) substrate that includes a buried insulator layer (not shown). In this case, the silicon-germanium alloy layer of the SOI substrate can include a p-doped silicon-germanium alloy region 30 and an n-doped silicon-germanium alloy region 40 that are located direction on a top surface of the buried insulator layer.

The p-doped silicon-germanium alloy region 30 and the n-doped silicon-germanium alloy region 40 are single crystalline. In one embodiment, the entirety of the silicon-germanium alloy layer (10, 30, 40) can be single crystalline with epitaxial alignment of atoms throughout. If the substrate 8 is a bulk substrate, the entirety of the substrate 8 can be single crystalline with epitaxial alignment of atoms throughout. If the substrate 8 is an SOI substrate, the entirety of the top semiconductor layer above the buried insulator layer can be a silicon-germanium alloy layer, which can be single crystalline and having epitaxial alignment of atoms throughout.

At least one shallow trench isolation structure 24 can be formed on the top surface of the substrate 8. For example, shallow trenches can be formed by lithographic patterning and anisotropic etching. The shallow trenches can be filled with a dielectric material, which is subsequently planarized to remove excess portions above the top surface of the substrate 8. The remaining portions of the dielectric material constitute the at least one shallow trench isolation structure 24, which is typically located between the p-doped silicon-germanium alloy region 30 and the n-doped silicon-germanium alloy region 40.

A gate dielectric layer, a gate electrode layer, and a dielectric gate cap layer are sequentially deposited on the top surface of the substrate 8, and lithographically patterned to form a first gate stack and a second gate stack. The first gate stack includes a first gate dielectric 50A, a first gate electrode 54A, and a first dielectric gate cap 58A. The second gate stack includes a second gate dielectric 50B, a second gate electrode 54B, and a second dielectric gate cap 58B. The first gate stack (50A, 54A, 58A) is located above the p-doped silicon-germanium alloy region 30, and the second gate stack (50B, 54B, 58B) is located above the n-doped silicon-germanium alloy region 40. The area of the first exemplary semiconductor structure including the first gate stack (50A, 54A, 58A) and the p-doped silicon-germanium alloy region 30 is herein referred to as a first device region 100, in which an n-type field effect transistor is subsequently formed. The area of the second exemplary semiconductor structure including the second gate stack (50B, 54B, 58N) and the n-doped silicon-germanium alloy region 40 is herein referred to as a second device region 100, in which a p-type field effect transistor is subsequently formed.

The first gate stack (50A, 54A, 58A) and the second gate stack (50B, 54B, 58B) may include the same gate dielectric material, or may include different dielectric materials, for the first gate dielectric 50A and the second gate dielectric 50B. Further, the first and second gate electrodes (54A, 54B) can include doped semiconductor materials and/or metallic materials. The first and second dielectric gate caps (58A, 58B) include a dielectric material such as silicon oxide or silicon nitride.

An n-doped source extension region 32 and an n-doped drain extension region 32' can be formed in the first device region 100 by implanting n-type dopants in a masked ion implantation step. The dopant concentration in the n-doped source extension region 32 and the n-doped drain extension region 32' can be from $1.0 \times 10^{19}/cm^3$ to $5.0 \times 10^{20}/cm^3$, although lesser and greater dopant concentrations can also be employed. The n-doped source extension region 32 and the n-doped drain extension region 32' include an n-doped silicon-germanium alloy, which has the same ratio of germanium atoms to silicon atoms as the underlying silicon-germanium layer 10, the p-doped silicon-germanium alloy region 30 and the n-doped silicon-germanium alloy region 40.

Likewise, a p-doped source extension region 42 and a p-doped drain extension region 42' can be formed in the second device region 200 by implanting p-type dopants in another masked ion implantation step. The dopant concentration in the p-doped source extension region 42 and the p-doped drain extension region 42' can be from $1.0 \times 10^{19}/cm^3$ to $5.0 \times 10^{20}/cm^3$, although lesser and greater dopant concentrations can also be employed. The p-doped source extension region 42 and the p-doped drain extension region 42' include a p-doped silicon-germanium alloy, which has the same ratio of germanium atoms to silicon atoms as the underlying silicon-germanium layer 10, the p-doped silicon-germanium alloy region 30 and the n-doped silicon-germanium alloy region 40.

Figure 2:
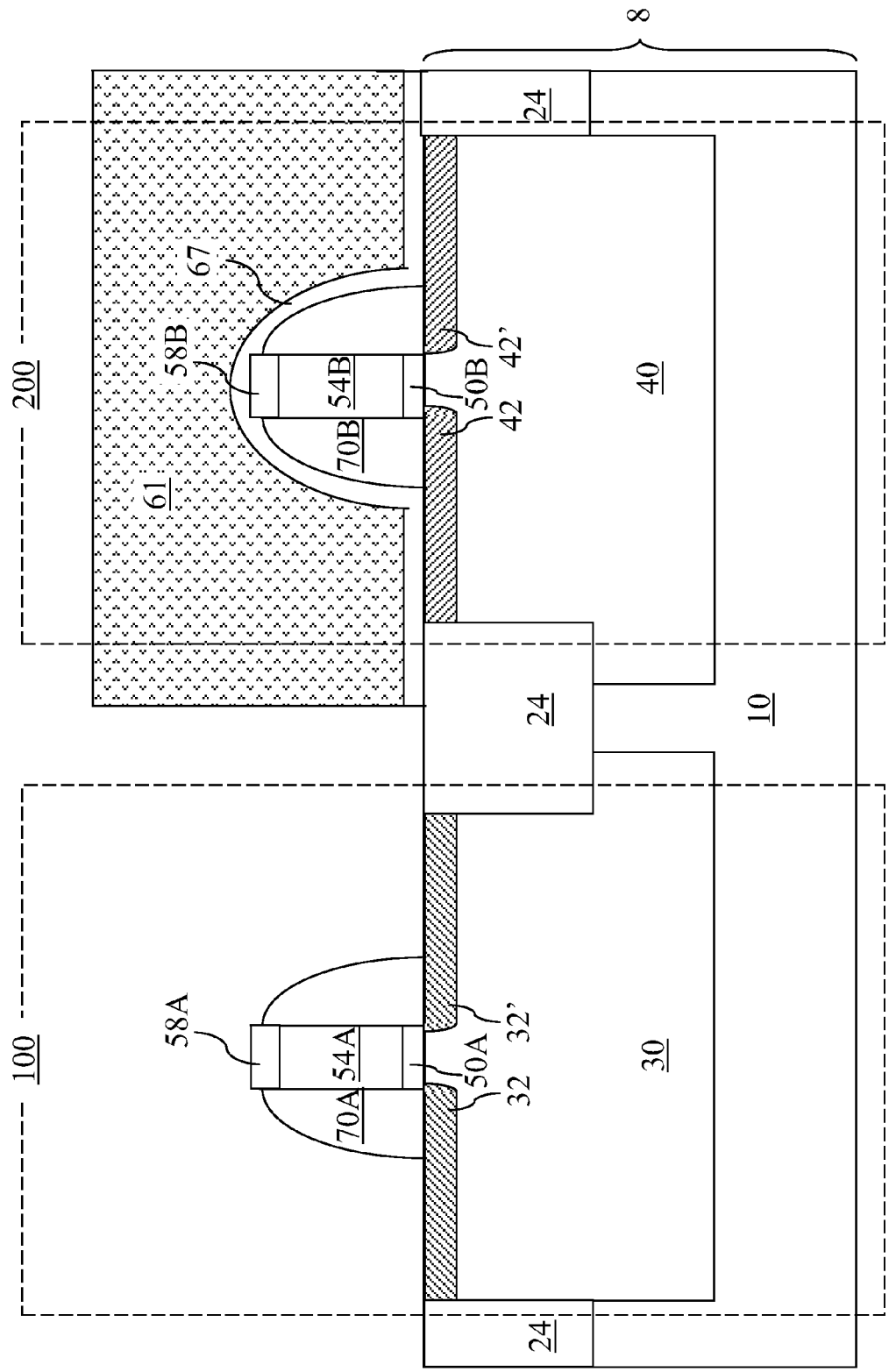

Referring to FIG. 2, a first gate spacer 70A and a second gate spacer 70B are formed by deposition of a dielectric material, for example, by chemical vapor deposition, followed by an anisotropic ion etch. The dielectric material can be, for example, silicon oxide, silicon nitride, or a combination thereof. Each of the first and second gate spacers (70A, 70B) can be composed of a single dielectric material, or can include a plurality of dielectric materials in multiple layers.

A first dielectric masking layer 67 is deposited over the top surfaces of the first and second dielectric gate caps (58A, 58B), the first and second gate spacers (70A, 70B), and the exposed surfaces of the substrate 8. The first dielectric masking layer 67 includes a dielectric material, which is preferably different from the dielectric materials of the first and second gate caps (58A, 58B) and the outer surfaces of the first and second gate spacers (70A, 70B). For example, the dielectric material of the first and second gate caps (58A, 58B) and the outer surfaces of the first and second gate spacers (70A, 70B) can include silicon oxide, and the dielectric material of the first dielectric masking layer 67 can be silicon nitride.

A first photoresist layer 61 is applied over the top surface of the first dielectric masking layer 67 and is lithographically patterned to expose the portion of the first dielectric masking layer 67 in the first device region 100, while covering the portion of the first dielectric masking layer 67 in the second device region 200. An etch is employed to remove the portion of the first dielectric masking layer 67 in the first device region 100 selective to the first gate spacer 70A and the first dielectric gate cap 58A. The etch can be an anisotropic etch. The first photoresist layer 61 may be removed at this step or at a subsequent step.

Figure 3:
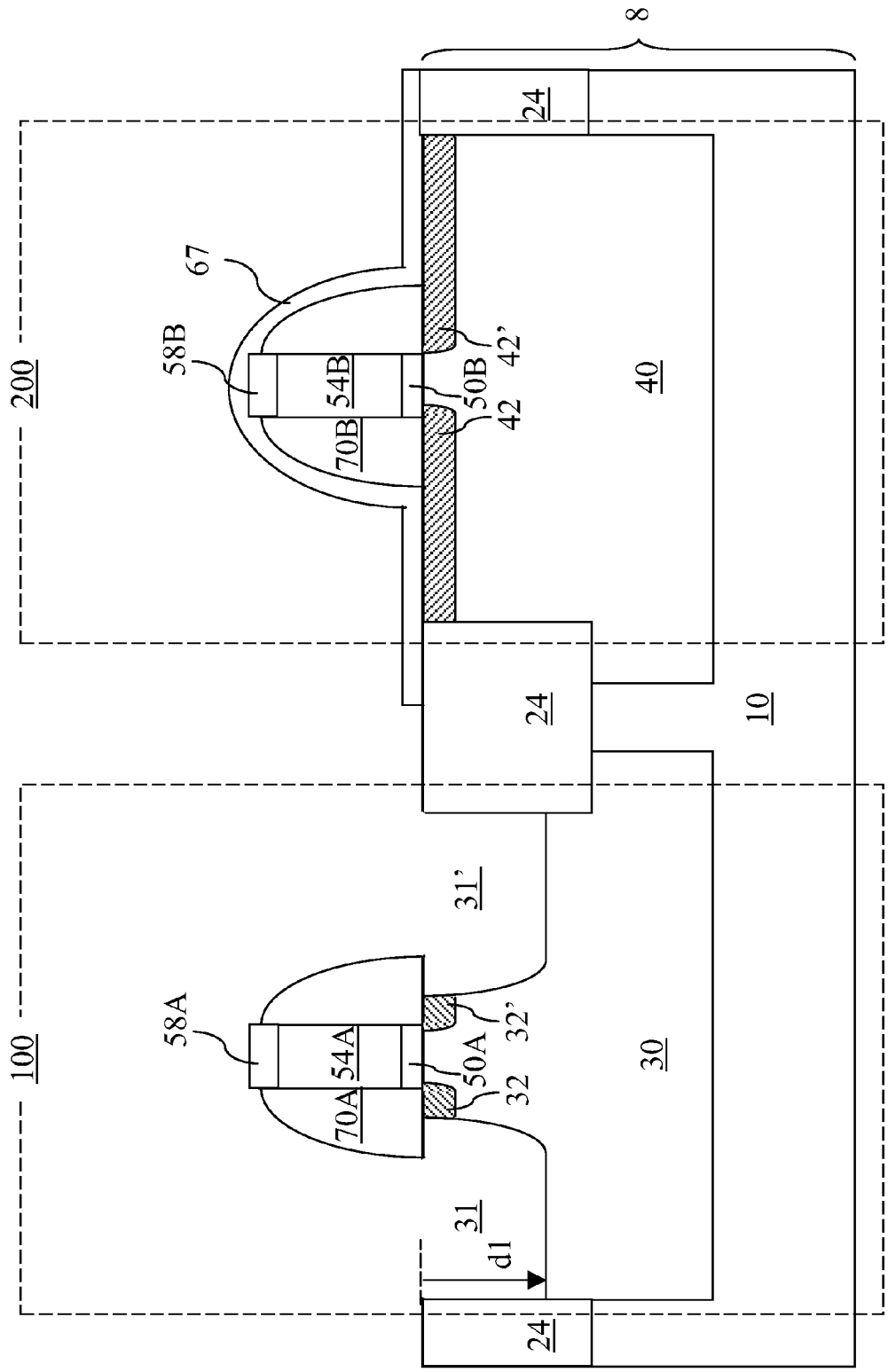

Referring to FIG. 3, an anisotropic etch is performed to recess exposed portions of the silicon-germanium alloy material in the first device region 100 employing the combination of the first dielectric masking layer 67, the at least one shallow trench isolation structure 24, the first gate spacer 70A, and the first dielectric gate cap 58A as an etch mask. If the first photoresist layer 61 is present, the first photoresist layer 61 is employed as a part of the etch mask instead of the first dielectric masking layer 67. A first source-side trench 31 and a first drain-side trench are formed in the first device region 100. The first source-side trench 31 and the first drain-side trench 31' has a planar horizontal bottom surface located at a first depth d1, which is less than the thickness of the at least one shallow trench isolation structure 24, i.e., the vertical distance between a top surface and a bottom surface of one of the at least one shallow trench isolation structure 24. If still present, the first photoresist layer 61 is removed at this step.

Figure 4:
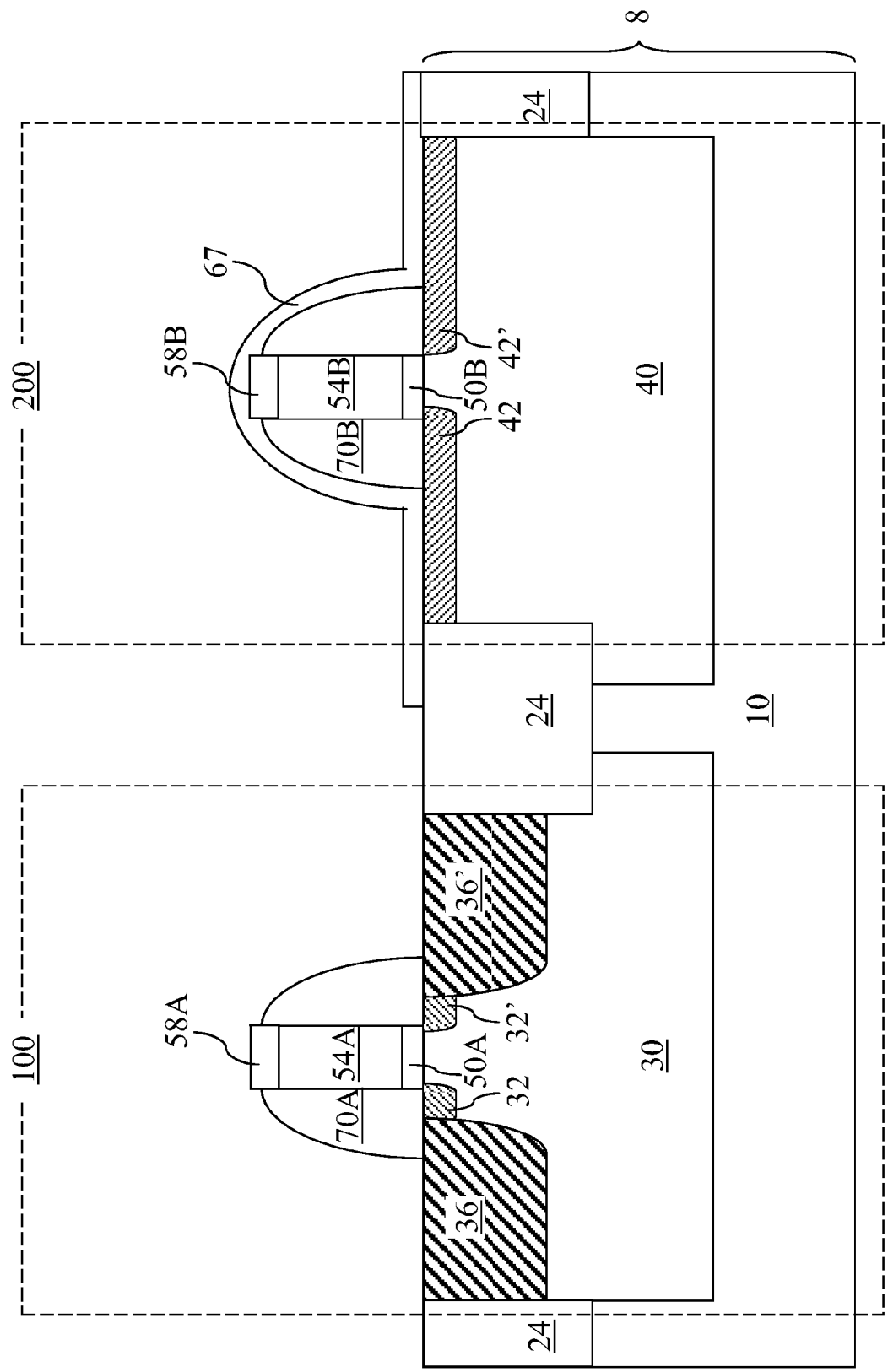

Referring to FIG. 4, an n-doped silicon-containing material is deposited by selective epitaxy to fill the first source-side trench 31 and the first drain-side trench 31'. The n-doped silicon-containing material deposited in the first source-side trench 31 forms a silicon-containing source region 36, and the n-doped silicon-containing material deposited in the first drain-side trench 31' forms a silicon-containing drain region 36'. The top surfaces of the silicon-containing source region 36 and the silicon-containing drain region 36' can be coplanar with, located above, or located below, the interface between the p-doped silicon-germanium alloy region 30 and the first gate dielectric 50A.

The n-doped silicon-containing material includes silicon and at least one n-type dopant such as P, As, and Sb. The n-doped silicon-containing material can be n-doped silicon, or can be an n-doped silicon-germanium alloy. In other words, the n-doped silicon-containing material may, or may not, include germanium. In case the n-doped silicon-containing material does not include germanium, the silicon-containing source region 36 and the silicon-containing drain region 36' can consist of silicon and at least one n-type dopant. In case the n-doped silicon-containing material includes germanium, the silicon-containing source region 36 and the silicon-containing drain region 36' can include an alloy of silicon, germanium, and at least one n-type dopant. In this case, the silicon-to-germanium ratio of the silicon containing material of the silicon-containing source region 36 and the silicon-containing drain region 36' is greater than the silicon-to-germanium ratio of the silicon-germanium alloy layer (10, 30, 40).

The selective epitaxy process deposits the silicon-containing material only on exposed semiconductor surfaces, which are the exposed surfaces of the p-doped silicon-germanium alloy region 30, the n-doped source extension region 32, and the n-doped drain extension region 32'. The selective epitaxy process proceeds on semiconductor surfaces selective to dielectric surfaces so that the silicon-containing material is not deposited on dielectric surfaces. The selective epitaxy process can employ at least one reactant including silicon, at least one dopant gas, and at least one etchant. For example, the at least one reactant gas can include silane, disilane, dichlorosilane, trichlorosilane, and silicon tetrachloride. If the silicon-containing material includes germanium, the at least one reactant gas can also include germane, digermane, dichlorogermane, and germane tetrachloride. The at least one dopant gas can be phosphine, arsine, and/or stibine. The selective epitaxy process employs in-situ doping, i.e., the dopants are incorporated into the deposited material during deposition. The at least one etchant can be hydrogen chloride gas. Because the deposition rate of the silicon-containing material on semiconductor surfaces is greater than the nucleation rate of the silicon-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate. The first dielectric masking layer 67 is subsequently removed selective to the dielectric materials of the first and second dielectric gate caps (58A, 58B), the first and second gate spacers (70A, 70B), and the semiconductor materials in the substrate 8.

The process conditions for the selective epitaxy process can be selected to facilitate epitaxial alignment of atoms between a single crystalline silicon-germanium alloy of the p-doped silicon-germanium alloy region 30 and the silicon-containing source region 36 and the silicon-containing drain region 36'. In this case, the entirety of the p-doped silicon-germanium alloy region 30, the silicon-containing source region 36, and the silicon-containing drain region 36' can be single crystalline with epitaxial atomic alignment throughout. The first dielectric masking layer 67 is subsequently removed, for example, by a wet etch.

Figure 5:
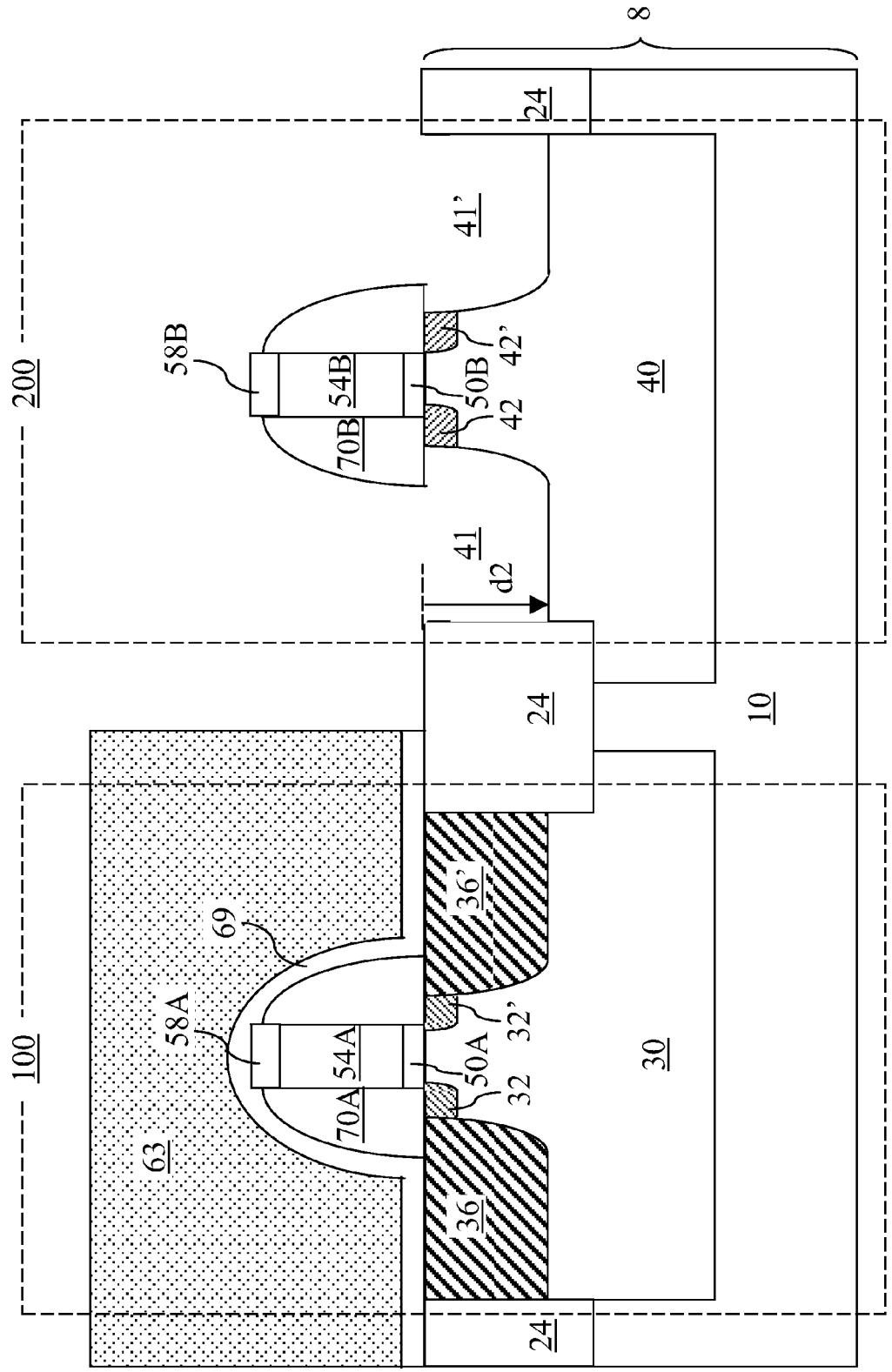

Referring to FIG. 5, a second dielectric masking layer 69 is deposited over the top surfaces of the first and second dielectric gate caps (58A, 58B), the first and second gate spacers (70A, 70B), and the exposed surfaces of the substrate 8. The second dielectric masking layer 69 includes a dielectric material, which is preferably different from the dielectric materials of the first and second gate caps (58A, 58B) and the outer surfaces of the first and second gate spacers (70A, 70B). For example, the dielectric material of the first and second gate caps (58A, 58B) and the outer surfaces of the first and second gate spacers (70A, 70B) can include silicon oxide, and the dielectric material of the second dielectric masking layer 69 can be silicon nitride.

A second photoresist layer 63 is applied over the top surface of the second dielectric masking layer 69 and is lithographically patterned to expose the portion of the second dielectric masking layer 69 in the second device region 200, while covering the portion of the second dielectric masking layer 69 in the first device region 100. An etch is employed to remove the portion of the second dielectric masking layer 69 in the second device region 200 selective to the second gate spacer 70B and the second dielectric gate caps 58B. The etch can be an anisotropic etch. The second photoresist layer 63 may be removed at this step or at a subsequent step.

An anisotropic etch is performed to recess exposed portions of the silicon-germanium alloy material in the second device region 200 employing the combination of the second dielectric masking layer 69, the at least one shallow trench isolation structure 24, the second gate spacer 70B, and the second dielectric gate cap 58B as an etch mask. If the second photoresist layer 63 is present, the second photoresist layer 63 is employed as a part of the etch mask instead of the second dielectric masking layer 69. A second source-side trench 41 and a first drain-side trench are formed in the second device region 200. Each of the second source-side trench 41 and the second drain-side trench 41' has a planar horizontal bottom surface located at a second depth d2, which is less than the thickness of the at least one shallow trench isolation structure 24, i.e., the vertical distance between a top surface and a bottom surface of one of the at least one shallow trench isolation structure 24. If still present, the second photoresist layer 63 is removed at this step.

Figure 6:
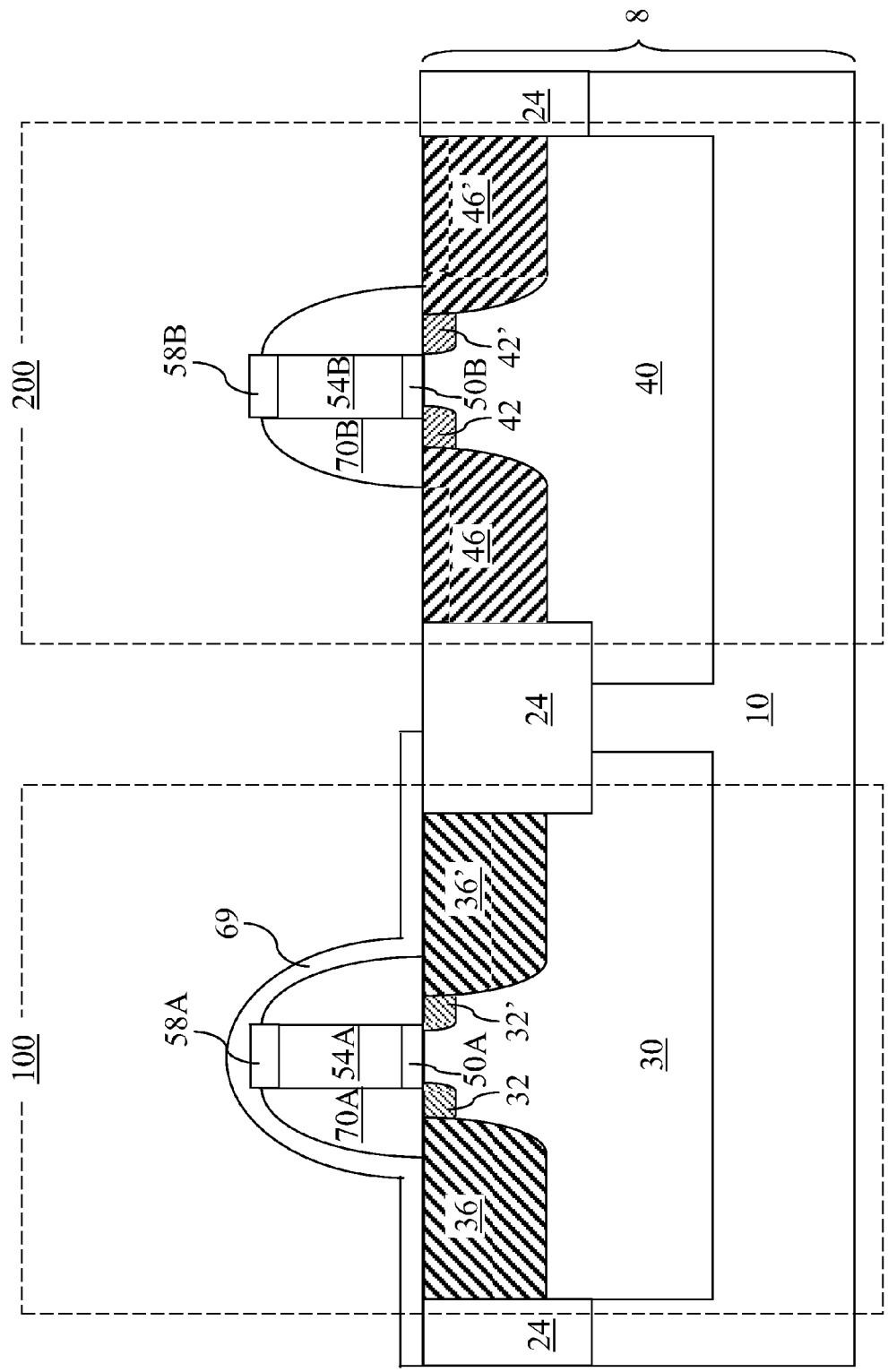

Referring to FIG. 6, a p-doped germanium-containing material is deposited by selective epitaxy to fill the second source-side trench 41 and the second drain-side trench 41'. The p-doped germanium-containing material deposited in the second source-side trench 41 forms a germanium-containing source region 46, and the p-doped germanium-containing material deposited in the second drain-side trench 41' forms a germanium-containing drain region 46'. The top surfaces of the germanium-containing source region 46 and the germanium-containing drain region 46' can be coplanar with, located above, or located below, the interface between the n-doped silicon-germanium alloy region 40 and the second gate dielectric 50B.

The p-doped germanium-containing material includes germanium and at least one p-type dopant such as B. The p-doped germanium-containing material can be p-doped germanium, or can be an p-doped germanium-containing alloy. In other words, the p-doped germanium-containing material may, or may not, include silicon. In case the p-doped germanium-containing material does not include silicon, the germanium-containing source region 46 and the germanium-containing drain region 46' can consist of germanium and at least one p-type dopant. In case the p-doped germanium-containing material includes silicon, the germanium-containing source region 46 and the germanium-containing drain region 46' can include an alloy of silicon, germanium, and at least one p-type dopant. In this case, the silicon-to-germanium ratio of the semiconductor material of the germanium-containing source region 46 and the germanium-containing drain region 46' is less than the silicon-to-germanium ratio of the silicon-germanium alloy layer (10, 30, 40).

The selective epitaxy process deposits the germanium-containing material only on exposed semiconductor surfaces, which are the exposed surfaces of the n-doped silicon-germanium alloy region 40, the p-doped source extension region 42, and the p-doped drain extension region 42'. The selective epitaxy process proceeds on semiconductor surfaces selective to dielectric surfaces so that the germanium-containing material is not deposited on dielectric surfaces. The selective epitaxy process can employ at least one reactant including germanium, at least one dopant gas, and at least one etchant. For example, the at least one reactant gas can include germane, digermane, dichlorogermane, and germane tetrachloride. If the germanium-containing material includes silicon, the at least one reactant gas can also include silane, disilane, dichlorosilane, trichlorosilane, and silicon tetrachloride. The at least one dopant gas can be diborane. The selective epitaxy process employs in-situ doping, i.e., the dopants are incorporated into the deposited material during deposition. The at least one etchant can be hydrogen chloride gas. Because the deposition rate of the germanium-containing material on semiconductor surfaces is greater than the nucleation rate of the germanium-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate.

The process conditions for the selective epitaxy process can be selected to facilitate epitaxial alignment of atoms between a single crystalline silicon-germanium alloy of the n-doped silicon-germanium alloy region 40 and the germanium-containing source region 46 and the germanium-containing drain region 46'. In this case, the entirety of the n-doped silicon-germanium alloy region 40, the germanium-containing source region 46, and the germanium-containing drain region 46' can be single crystalline with epitaxial atomic alignment throughout.

Figure 7:
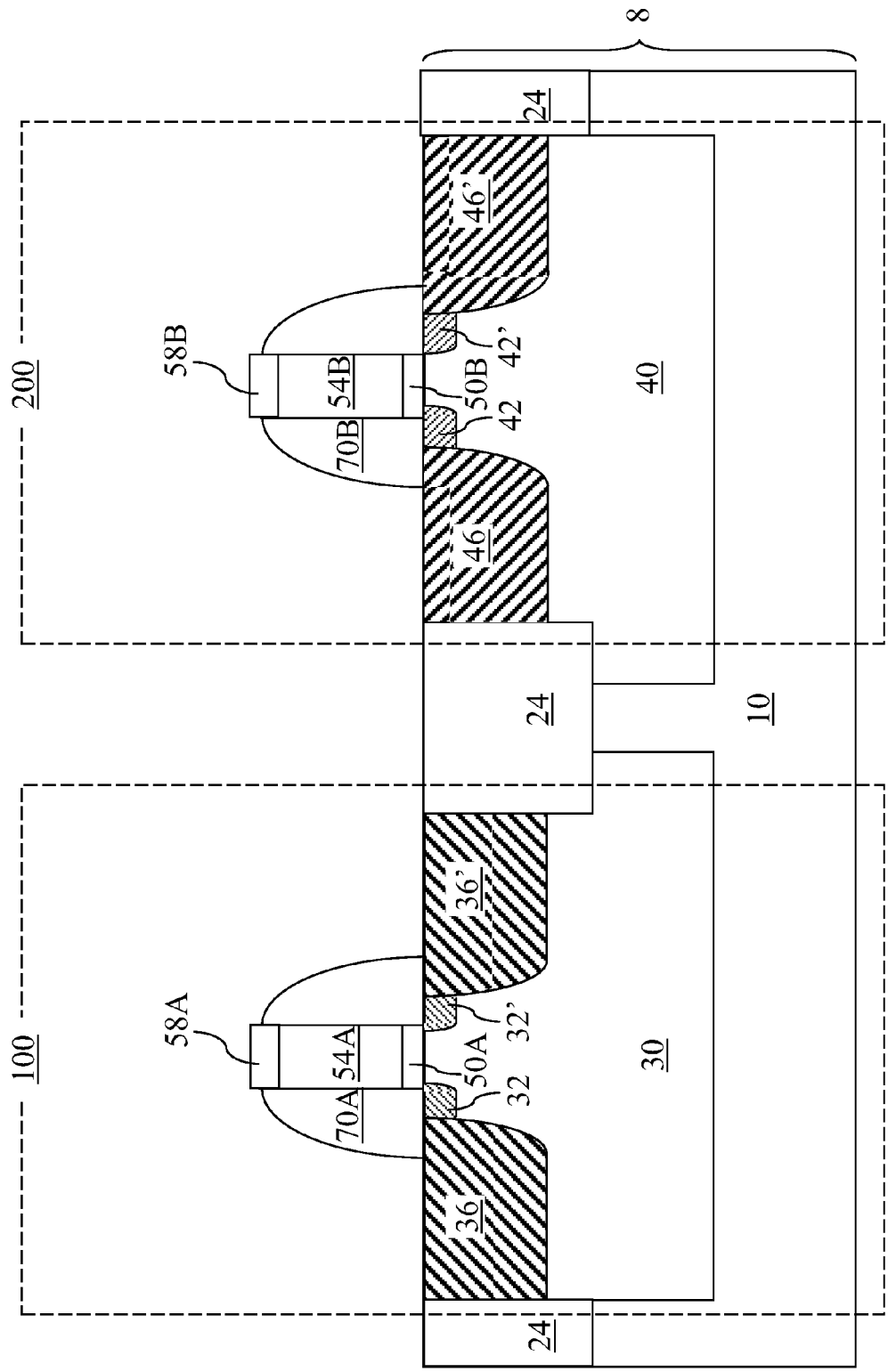

Referring to FIG. 7, the second dielectric masking layer 69 is removed, for example, by a wet etch. The first exemplary semiconductor structure includes a p-type field effect transistor (PFET) located on a silicon-germanium alloy layer (10, 30, 40) in a substrate 8 in the second device region 200. The PFET is located in an n-doped portion of the silicon-germanium alloy layer, i.e., the n-doped silicon-germanium alloy region 40. The PFET includes a germanium-containing source region 46 and a germanium-containing drain region 46'. The silicon-germanium alloy layer (10, 30, 40) includes silicon at a greater atomic concentration than the germanium-containing source region 46 and the germanium-containing drain region 46'. The germanium-containing source region 46 and the germanium-containing drain region 46' have the same composition.

Further, the first exemplary semiconductor structure includes an n-type field effect transistor (NFET) located on the silicon-germanium alloy layer (10, 30, 40) in the substrate 8 in the first device region 100. The NFET is located in a p-doped portion of the silicon-germanium alloy layer, i.e., the p-doped silicon-germanium alloy region 30. The NFET includes a silicon-containing source region 36 and a silicon-containing drain region 36'. The silicon-germanium alloy layer (10, 30, 40) includes germanium at a greater atomic concentration than the silicon-containing source region 36 and the silicon-containing drain region 36'. The silicon-containing source region 36 and the silicon-containing drain region 36' have the same composition.

The p-n junctions between the silicon-germanium alloy layer (10, 30, 40) and each of the silicon-containing source region 36, the silicon-containing drain region 36', the germanium-containing source region 46, and the germanium-containing drain region 46' coincide with material junctions at which the composition of materials change. Specifically, a first interface between the germanium-containing source region 46 and the n-doped portion of the silicon-germanium alloy layer (10, 30, 40), i.e., the n-doped silicon-germanium alloy region 40, is a p-n junction. A second interface between the germanium-containing drain region 46' and the n-doped portion of the silicon-germanium alloy layer (10, 30, 40) is another p-n junction. A third interface between the silicon-containing source region 36 and the p-doped portion of the silicon-germanium alloy layer, i.e., the p-doped silicon-germanium alloy region 30, is yet another p-n junction. A fourth interface between the silicon-containing drain region 36' and the p-doped portion of the silicon-germanium alloy layer (10, 30, 40) is still another p-n junction.

The atomic radius of a silicon atom is 0.146 nm, and the atomic radius of a germanium atom is 0.153 nm. Because the size of a germanium atom is greater than the size of a silicon and silicon and germanium have the same crystal structure, a silicon-germanium alloy having a greater concentration of germanium and in a relaxed state, i.e., without external stress, has a greater crystallographic lattice parameter than a silicon-germanium alloy having a lesser concentration of germanium and in a relaxed state. A silicon-germanium alloy having a greater concentration of germanium embedded in, and epitaxially aligned to, a silicon-germanium alloy having a lesser concentration of germanium is compressed from the relaxed stress, and therefore applies a compressive stress to the surrounding regions of the silicon-germanium alloy having the lesser concentration of germanium. Conversely, a silicon-germanium alloy having a lesser concentration of germanium embedded in, and epitaxially aligned to, a silicon-germanium alloy having a greater concentration of germanium is in a tensile state, and therefore applies a tensile stress to the surrounding regions of the silicon-germanium alloy having the lesser concentration of germanium.

Thus, the silicon-containing source region 36 and the silicon-containing drain region 36' apply a tensile stress to the channel of the NFET along the direction of the channel, i.e., along the direction connecting the silicon-containing source region 36 and the silicon-containing drain region 36' (the horizontal direction in FIG. 7). The channel of the NFET is located between the n-doped source extension region 32 and the n-doped drain extension region 32'. The tensile stress applied to the channel of the NFET along the direction of the channel enhances the mobility of electrons, thereby increasing the on-current of the NFET.

The germanium-containing source region 46 and the germanium-containing drain region 46' apply a compressive stress to the channel of the PFET along the direction of the channel, i.e., along the direction connecting the germanium-containing source region 46 and the germanium-containing drain region 46' (the horizontal direction in FIG. 7). The channel of the PFET is located between the p-doped source extension region 42 and the p-doped drain extension region 42'. The compressive stress applied to the channel of the PFET along the direction of the channel enhances the mobility of holes, thereby increasing the on-current of the PFET.

Figure 8:
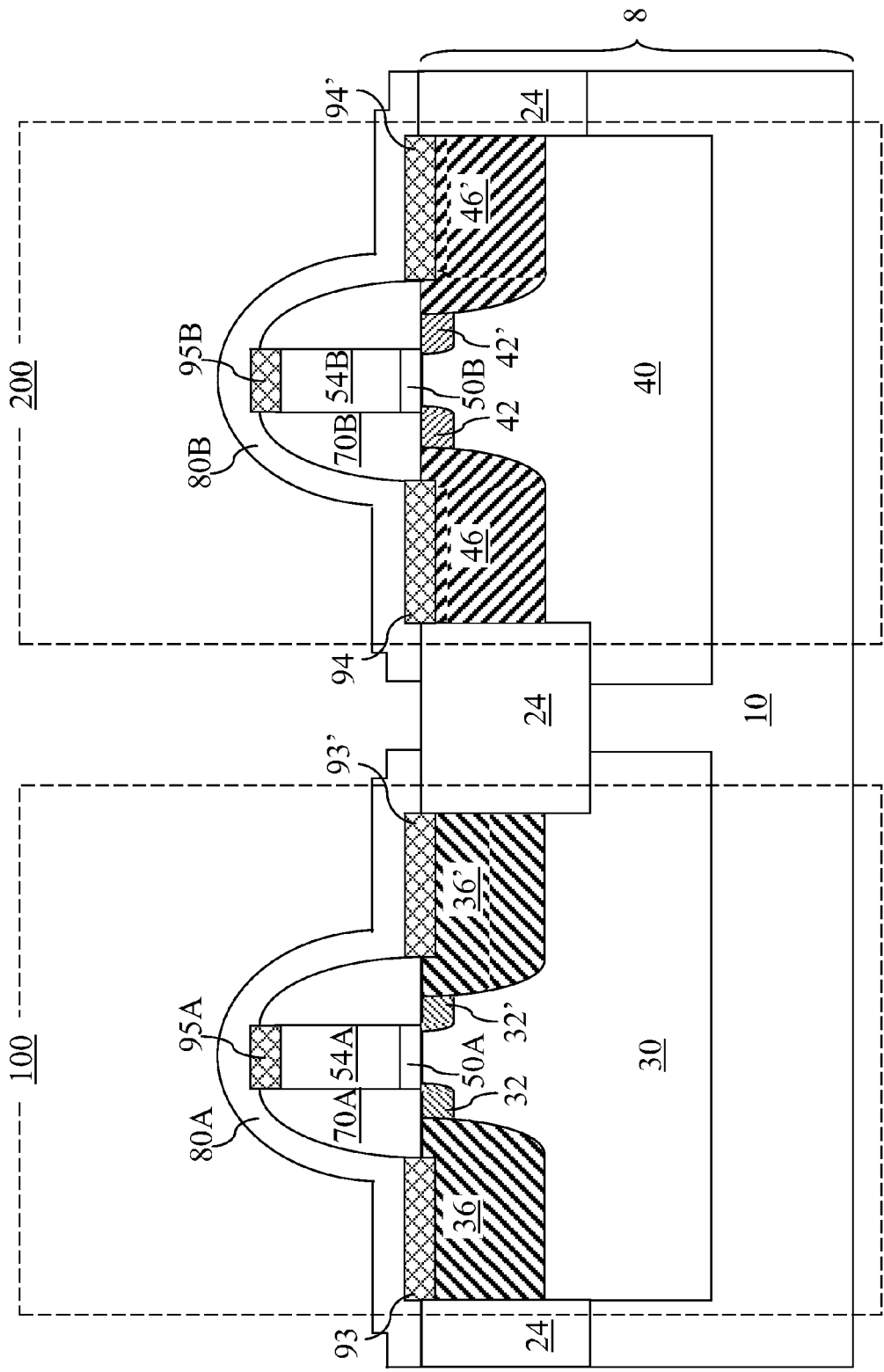

Referring to FIG. 8, the first and second dielectric gate caps (58A, 58B) are removed, for example, by a wet etch or a dry etch. Various metal-semiconductor alloy regions are formed, for example, by depositing a metal layer and inducing a reaction between the metal layer and underlying semiconductor materials. Unreacted portions of the metal layer are subsequently removed. The various metal-semiconductor alloy regions can include a first source-side metal-semiconductor alloy region 93 located on the silicon-containing source region 36, a first drain-side metal-semiconductor alloy region 93' located on the silicon-containing drain region 36', a second source-side metal-semiconductor alloy region 94 located on the germanium-containing source region 46, a second drain-side metal-semiconductor alloy region 94' located on the germanium-containing drain region 46', a first gate-side metal-semiconductor alloy region 95A located on the first gate electrode 54A, and a second gate-side metal-semiconductor alloy region 95B located on the second gate electrode 54B.

Because the silicon-containing source region 36 and the silicon-containing drain region 36' have the same composition, the first source-side metal-semiconductor alloy region 93 and the first drain-side metal-semiconductor alloy region 93' have the same composition. Because the germanium-containing source region 46 and the germanium-containing drain region 46' have the same composition, the second source-side metal-semiconductor alloy region 94 and the second drain-side metal-semiconductor alloy region 94' have the same composition. Because the silicon-containing source region 36 and the silicon-containing drain region 36' include silicon, the first source-side metal-semiconductor alloy region 93 and the first drain-side metal-semiconductor alloy region 93' include a metal silicide. Because the germanium-containing source region 46 and the germanium-containing drain region 46' includes germanium, the second source-side metal-semiconductor alloy region 94 and the second drain-side metal-semiconductor alloy region 94' include a metal germanide. In case the silicon-containing source region 36 and the silicon-containing drain region 36' and the germanium-containing source region 46 and the germanium-containing drain region 46' include silicon-germanium alloys, the first source-side metal-semiconductor alloy region 93 and the first drain-side metal-semiconductor alloy region 93' and the second source-side metal-semiconductor alloy region 94 and the second drain-side metal-semiconductor alloy region 94' include metal germano-silicides. In this case, the atomic percentage of germanium in the second source-side metal-semiconductor alloy region 94 and the second drain-side metal-semiconductor alloy region 94' is greater than the atomic percentage of germanium in the first source-side metal-semiconductor alloy region 93 and the first drain-side metal-semiconductor alloy region 93'.

The mobility of electrons of the NFET and the mobility of holes of the PFET can further be enhanced by forming stress-generating dielectric liners. Specifically, a tensile-stress-generating dielectric liner 80A can be deposited as a blanket layer, for example, by chemical vapor deposition, and lithographically patterned so that the tensile-stress-generating dielectric liner 80A is present only over the NFET. In this case, the tensile-stress-generating dielectric liner 80A applies additional tensile stress to the channel of the underlying NFET so that the mobility of electrons is further increased in the NFET. Further, a compressive-stress-generating dielectric liner 80B can be deposited as a blanket layer, for example, by chemical vapor deposition, and lithographically patterned so that the compressive-stress-generating dielectric liner 80B is present only over the PFET. In this case, the compressive-stress-generating dielectric liner 80B applies additional compressive stress to the channel of the underlying PFET so that the mobility of holes is further increased in the PFET. The tensile-stress-generating dielectric liner 80A and the compressive-stress-generating dielectric liner 80B are optional, i.e., may, or may not be present.

Figure 9:
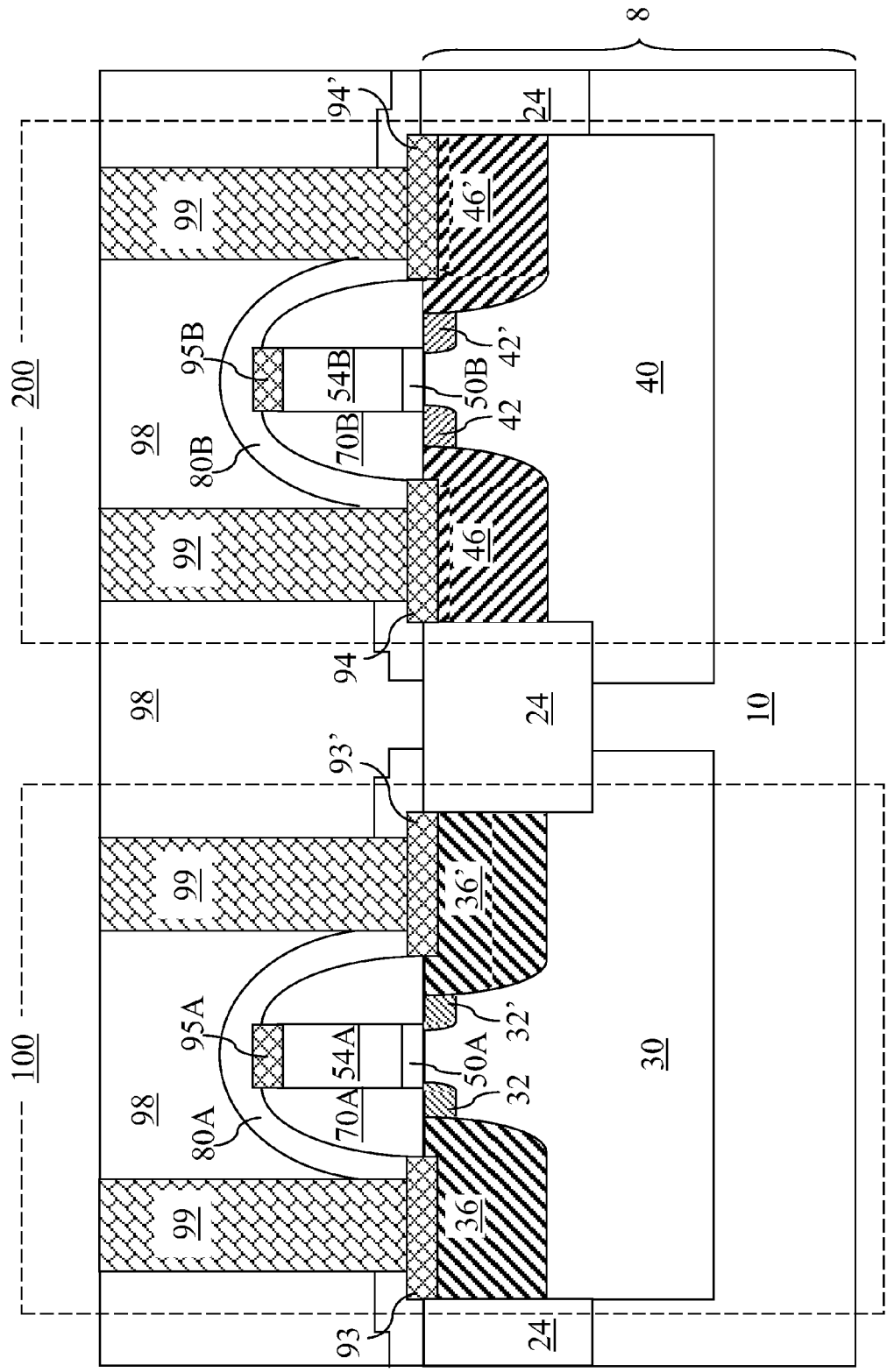

Referring to FIG. 9, a middle-of-line (MOL) dielectric layer 98 is formed over the first exemplary semiconductor structure, i.e., on the at least one shallow trench isolation structure 24 and the tensile-stress-generating dielectric liner 80A and the compressive-stress-generating dielectric liner 80B if present, or on the various metal-semiconductor alloy regions (93, 93', 94, 94', 95A, 95B). The MOL dielectric layer 98 may include, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 98 may be from about 200 nm to about 500 nm. Alternately, the MOL dielectric layer 98 may include an organosilicate glass (OSG) having a dielectric constant value of less than 2.8. The MOL dielectric layer 98 is preferably planarized, for example, by chemical mechanical polishing (CMP). Alternately, the MOL dielectric layer may be a self-planarizing material such as a spin-on glass (SOG).

Various contact via holes are formed in the MOL dielectric layer 98 and filled with metal to from various contact via structures 99. The formation of the various contact via holes may be effected by applying a photoresist (not shown) over the MOL dielectric layer 98 and lithographically patterning the photoresist to form a pattern of via holes. The pattern of the via holes is transferred into the MOL dielectric layer 98 by an anisotropic etch, which is preferably selective to the various metal semiconductor alloy portions to accommodate the differences in the height of the via holes to be formed in the MOL dielectric layer 98. A conductive material such as doped polysilicon or a metal is deposited into the via holes, for example, by chemical vapor deposition (CVD). Excess conductive material over the top surface of the MOL dielectric layer 98 is removed by a recess etch, a planarization process, or a combination thereof to form the various contact via structures 99.

Figure 10:
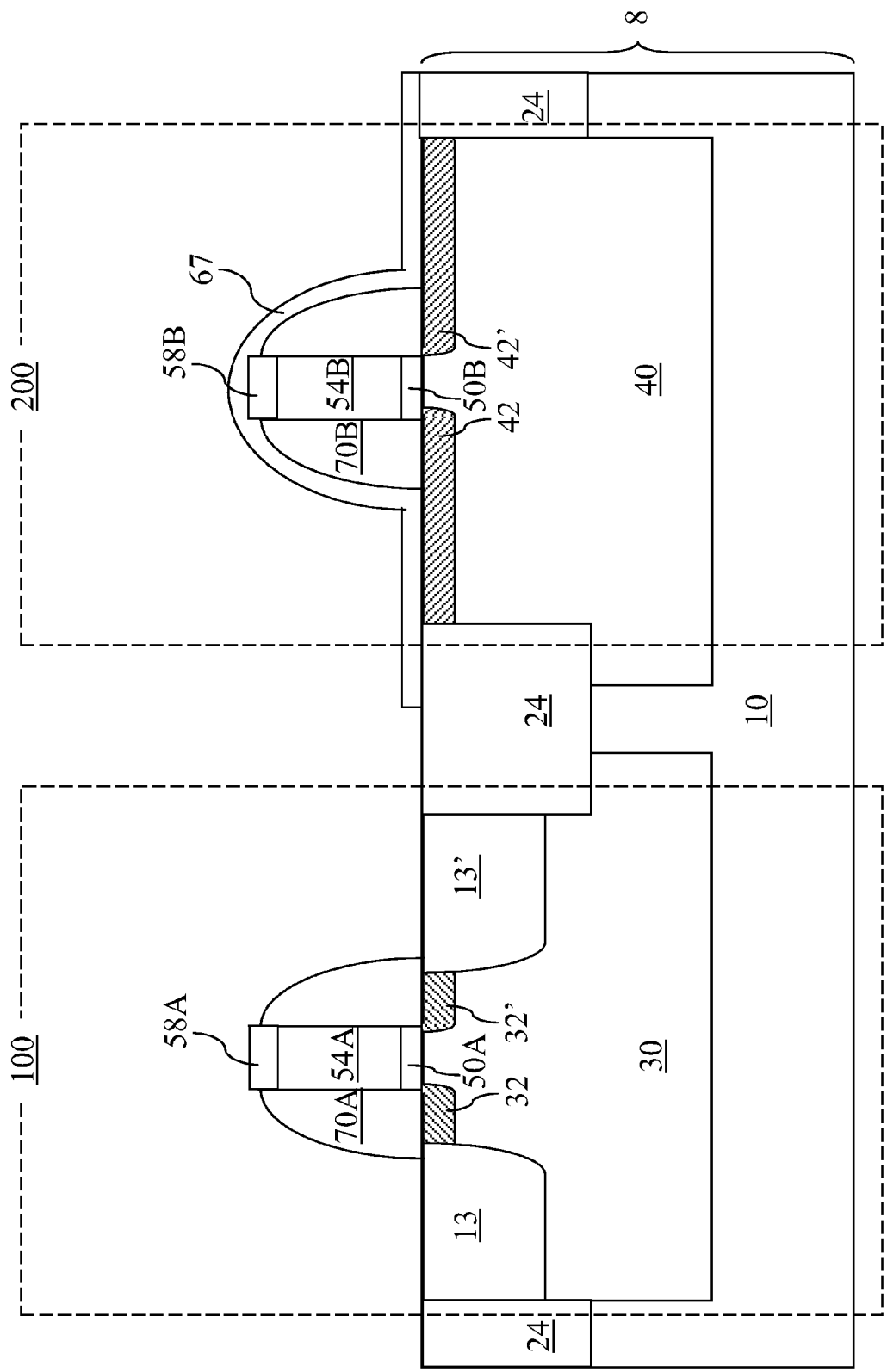
FIGS. 10-13 are sequential vertical cross-sectional views of a first variation of the first exemplary semiconductor structure according to the first embodiment of the present disclosure at various stages of a manufacturing process.

Referring to FIG. 10, a first variation of the first exemplary semiconductor structure according to the first embodiment of the present disclosure can be derived from the first exemplary semiconductor structure of FIG. 3 by depositing an undoped or p-doped silicon-containing material by selective epitaxy. Thus, the deposited semiconductor material is an undoped or p-doped silicon-containing material in the first variation compared with the n-doped silicon containing material in the first exemplary semiconductor structure of FIG. 4 in the first embodiment.

Specifically, the undoped or p-doped silicon-containing material is deposited by selective epitaxy to fill the first source-side trench 31 and the first drain-side trench 31'. The undoped or p-doped silicon-containing material deposited in the first source-side trench 31 forms a first silicon-containing material region 13, and the undoped or p-doped silicon-containing material deposited in the first drain-side trench 31' forms a second silicon-containing material region 13'. The top surfaces of the first silicon-containing material region 13 and the second silicon-containing material region 13' can be coplanar with, located above, or located below, the interface between the p-doped silicon-germanium alloy region 30 and the first gate dielectric 50A.

The undoped or p-doped silicon-containing material may, or may not, include germanium. If the deposited material is an undoped silicon-containing material, the deposited material includes silicon and does not include any dopant. The undoped silicon-containing material can consist of silicon, or can be a silicon-germanium alloy having a lesser silicon-to-germanium ratio than the silicon-germanium alloy layer (10, 30, 40). If the deposited material is a p-doped silicon-containing material, the deposited material includes silicon and at least one p-type dopant such as B. The concentration of p-type dopants in the first and second silicon-containing material regions (13, 13') is less than, or on the same order of magnitude as, the dopant concentration of the p-doped silicon-germanium alloy region 30, and is typically less than $3.0 \times 10^{18}/cm^3$. The p-doped silicon-containing material can consist of p-doped silicon, or can be a p-doped silicon-germanium alloy. In case the undoped or p-doped silicon-containing material includes germanium, the first silicon-containing material region 13 and the second silicon-containing material region 13' can include an alloy of silicon, germanium, and optionally at least one p-type dopant. In this case, the silicon-to-germanium ratio of the silicon containing material of the first and second silicon-containing material regions (13, 13') is greater than the silicon-to-germanium ratio of the silicon-germanium alloy layer (10, 30, 40).

The selective epitaxy process deposits the silicon-containing material only on exposed semiconductor surfaces, which are the exposed surfaces of the p-doped silicon-germanium alloy region 30, the n-doped source extension region 32, and the n-doped drain extension region 32'. The selective epitaxy process proceeds on semiconductor surfaces selective to dielectric surfaces so that the silicon-containing material is not deposited on dielectric surfaces. The selective epitaxy process can employ at least one reactant including silicon, at least one dopant gas, and at least one etchant. For example, the at least one reactant gas can include silane, disilane, dichlorosilane, trichlorosilane, and silicon tetrachloride. If the silicon-containing material includes germanium, the at least one reactant gas can also include germane, digermane, dichlorogermane, and germane tetrachloride. The at least one dopant gas can be diborane if the first and second silicon-containing material regions (13, 13') are p-doped. The at least one etchant can be hydrogen chloride gas. Because the deposition rate of the silicon-containing material on semiconductor surfaces is greater than the nucleation rate of the silicon-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate. The first dielectric masking layer 67 is subsequently removed selective to the dielectric materials of the first and second dielectric gate caps (58A, 58B), the first and second gate spacers (70A, 70B), and the semiconductor materials in the substrate 8.

The process conditions for the selective epitaxy process can be selected to facilitate epitaxial alignment of atoms between a single crystalline silicon-germanium alloy of the p-doped silicon-germanium alloy region 30 and the first and second silicon-containing material regions (13, 13'). In this case, the entirety of the p-doped silicon-germanium alloy region 30, the first silicon-containing material region 13, and the second silicon-containing material region 13' can be single crystalline with epitaxial atomic alignment throughout. The first dielectric masking layer 67 is subsequently removed, for example, by a wet etch.

Figure 11:
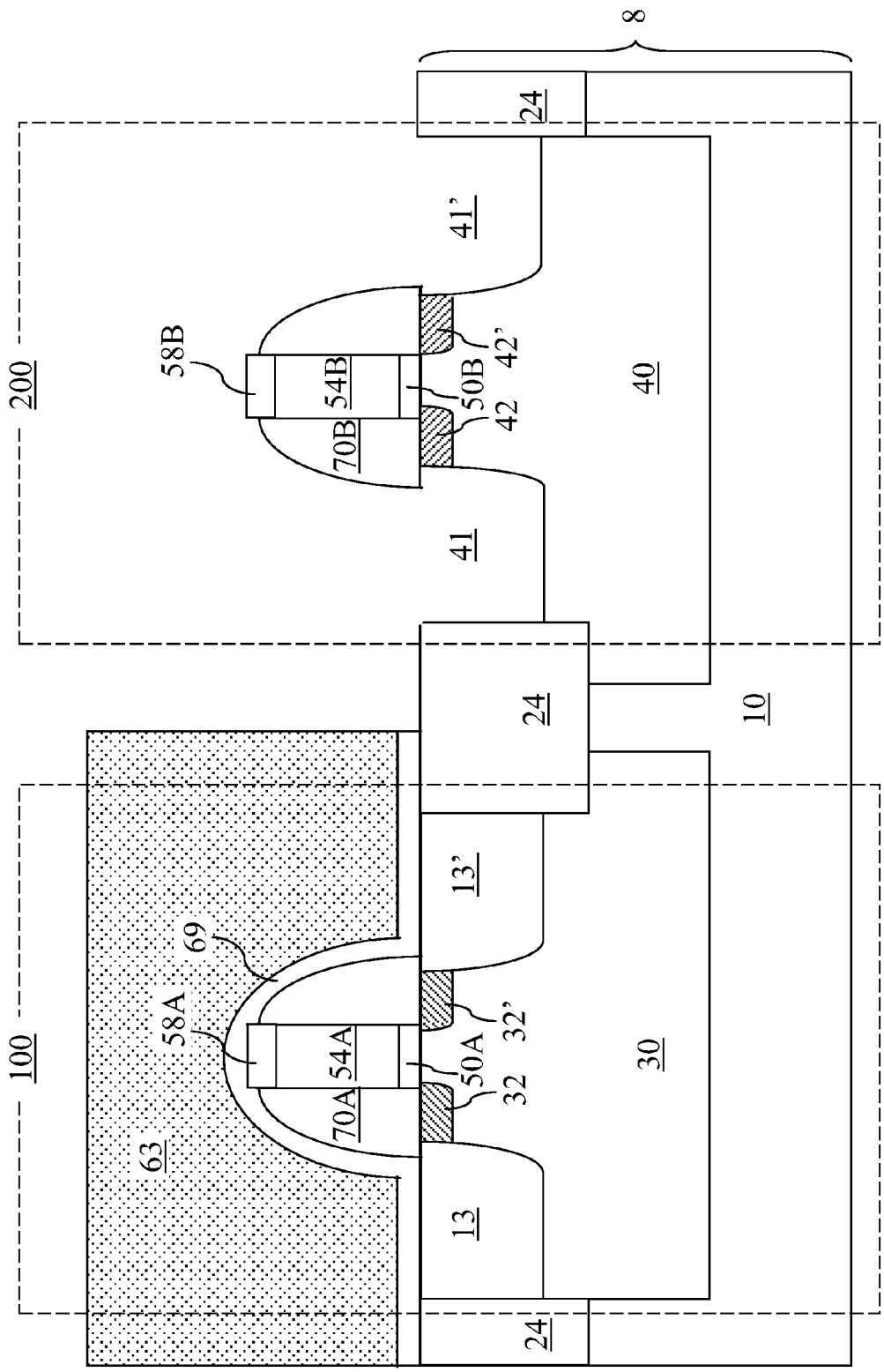

Referring to FIG. 11, a second dielectric masking layer 69 is deposited over the top surfaces of the first and second dielectric gate caps (58A, 58B), the first and second gate spacers (70A, 70B), and the exposed surfaces of the substrate 8. The second dielectric masking layer 69 includes a dielectric material, which is preferably different from the dielectric materials of the first and second gate caps (58A, 58B) and the outer surfaces of the first and second gate spacers (70A, 70B). For example, the dielectric material of the first and second gate caps (58A, 58B) and the outer surfaces of the first and second gate spacers (70A, 70B) can include silicon oxide, and the dielectric material of the second dielectric masking layer 69 can be silicon nitride.

A second photoresist layer 63 is applied over the top surface of the second dielectric masking layer 69 and is lithographically patterned to expose the portion of the second dielectric masking layer 69 in the second device region 200, while covering the portion of the second dielectric masking layer 69 in the first device region 100. An etch is employed to remove the portion of the second dielectric masking layer 69 in the second device region 200 selective to the second gate spacer 70B and the second dielectric gate caps 58B. The etch can be an anisotropic etch. The second photoresist layer 63 may be removed at this step or at a subsequent step.

An anisotropic etch is performed to recess exposed portions of the silicon-germanium alloy material in the second device region 200 employing the combination of the second dielectric masking layer 69, the at least one shallow trench isolation structure 24, the second gate spacer 70B, and the second dielectric gate cap 58B as an etch mask. If the second photoresist layer 63 is present, the second photoresist layer 63 is employed as a part of the etch mask instead of the second dielectric masking layer 69. A second source-side trench 41 and a first drain-side trench are formed in the second device region 200. The second source-side trench 41 and the second drain-side trench 41' has a planar horizontal bottom surface located at a second depth d2, which is less than the thickness of the at least one shallow trench isolation structure 24, i.e., the vertical distance between a top surface and a bottom surface of one of the at least one shallow trench isolation structure 24. If still present, the second photoresist layer 63 is removed at this step.

Figure 12:
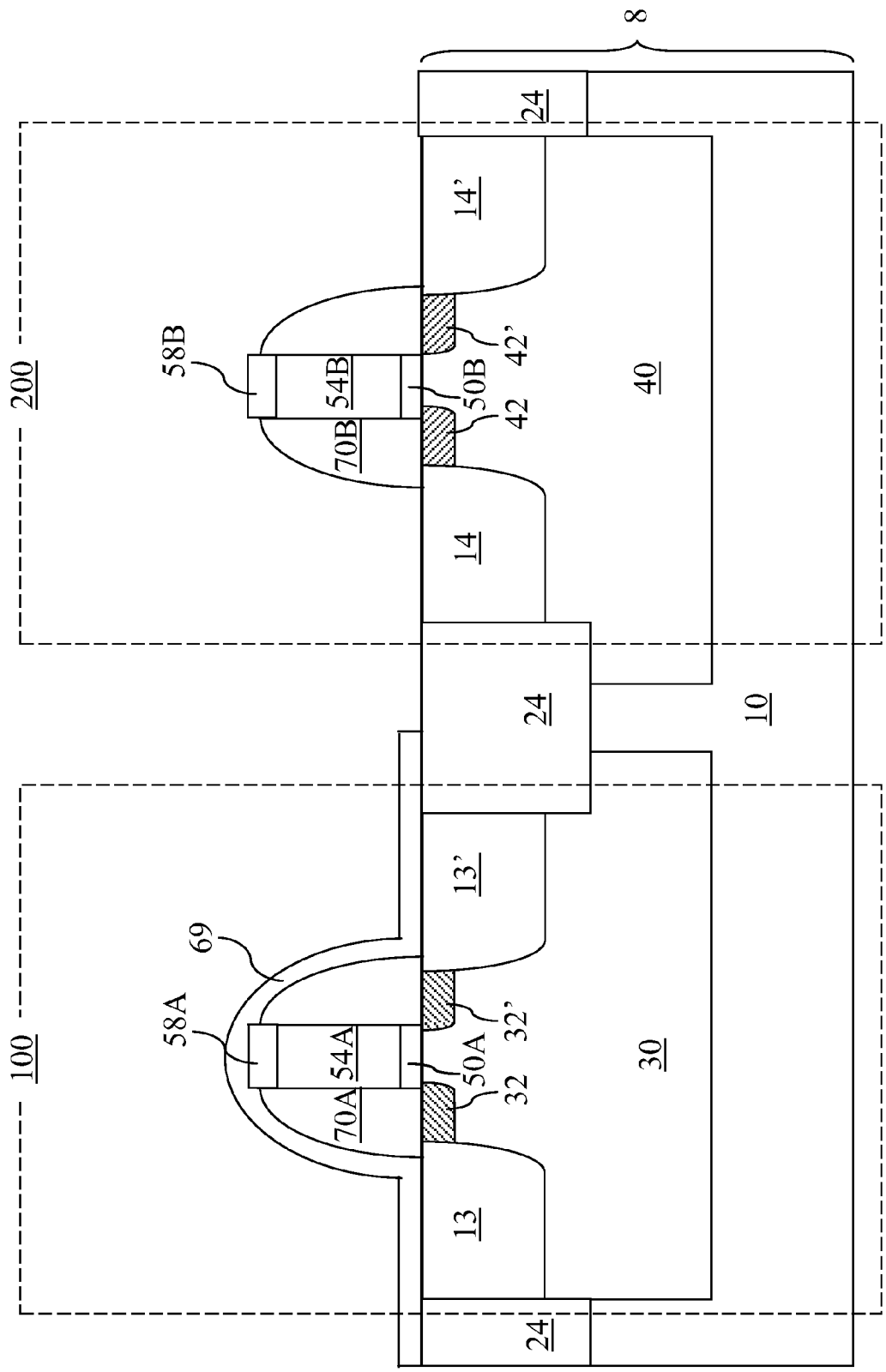

Referring to FIG. 12, an undoped or n-doped germanium-containing material is deposited by selective epitaxy to fill the second source-side trench 41 and the second drain-side trench 41'. The undoped or n-doped germanium-containing material deposited in the second source-side trench 41 forms a first germanium-containing material region 14, and the undoped or n-doped germanium-containing material deposited in the second drain-side trench 41' forms a second germanium-containing material region 14'. The top surfaces of the first germanium-containing material region 14 and the second germanium-containing material region 14' can be coplanar with, located above, or located below, the interface between the n-doped silicon-germanium alloy region 40 and the second gate dielectric 50B.

The undoped or n-doped germanium-containing material may, or may not, include silicon. If the deposited material is an undoped germanium-containing material, the deposited material includes germanium and does not include any dopant. The undoped germanium-containing material can consist of germanium, or can be a silicon-germanium alloy having a lesser silicon-to-germanium ratio than the silicon-germanium alloy layer (10, 30, 40). If the deposited material is an n-doped germanium-containing material, the deposited material includes germanium and at least one n-type dopant such as P, As, and Sb. The concentration of n-type dopants in the first and second germanium-containing material regions (14, 14') is less than, or on the same order of magnitude as, the dopant concentration of the n-doped silicon-germanium alloy region 40, and is typically less than $3.0 \times 10^{18}/cm^3$. The n-doped germanium-containing material can consist of n-doped germanium, or can be an n-doped silicon-germanium alloy. In case the undoped or n-doped germanium-containing material includes silicon, the first germanium-containing material region 13 and the second germanium-containing material region 13' can include an alloy of silicon, germanium, and optionally at least one n-type dopant. In this case, the silicon-to-germanium ratio of the germanium-containing material of the first and second germanium-containing material regions (14, 14') is less than the silicon-to-germanium ratio of the silicon-germanium alloy layer (10, 30, 40).

The selective epitaxy process deposits the germanium-containing material only on exposed semiconductor surfaces, which are the exposed surfaces of the n-doped silicon-germanium alloy region 40, the p-doped source extension region 42, and the p-doped drain extension region 42'. The selective epitaxy process proceeds on semiconductor surfaces selective to dielectric surfaces so that the germanium-containing material is not deposited on dielectric surfaces. The selective epitaxy process can employ at least one reactant including germanium, at least one dopant gas, and at least one etchant. For example, the at least one reactant gas can include germane, digermane, dichlorogermane, and germane tetrachloride. If the germanium-containing material includes silicon, the at least one reactant gas can also include silane, disilane, dichlorosilane, trichlorosilane, and silicon tetrachloride. The at least one dopant gas can be phosphine, arsine, or stibine, if employed. The at least one etchant can be hydrogen chloride gas. Because the deposition rate of the germanium-containing material on semiconductor surfaces is greater than the nucleation rate of the germanium-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate.

The process conditions for the selective epitaxy process can be selected to facilitate epitaxial alignment of atoms between a single crystalline silicon-germanium alloy of the n-doped silicon-germanium alloy region 40 and the first and second germanium-containing material regions (14, 14'). In this case, the entirety of the n-doped silicon-germanium alloy region 40, the first germanium-containing material region 14, and the second germanium-containing material region 14' can be single crystalline with epitaxial atomic alignment throughout.

Figure 13:
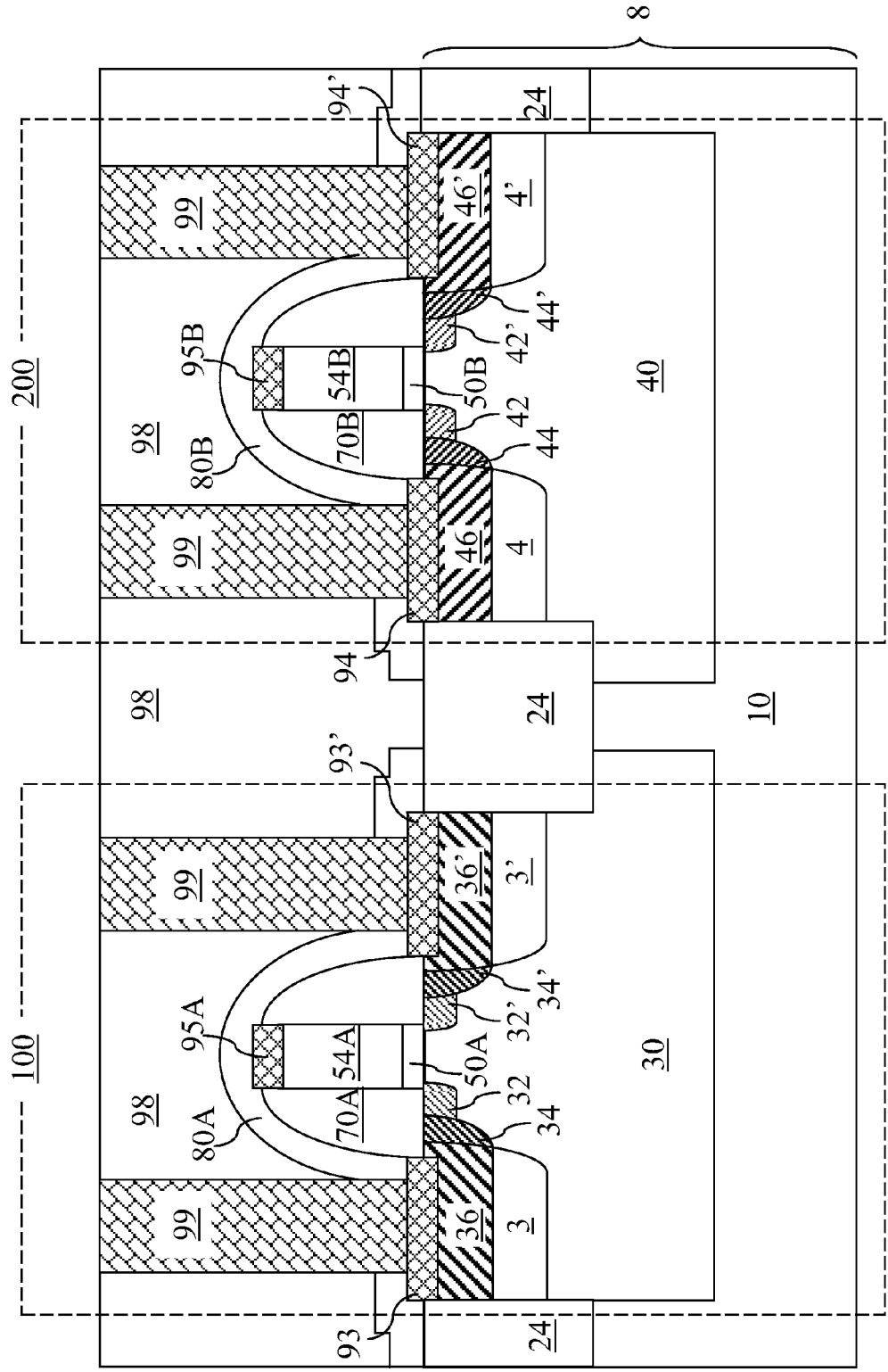

Referring to FIG. 13, the second dielectric masking layer 69 is removed, for example, by a wet etch. N-type dopants are implanted into the upper portions of the first and second silicon-containing material regions (13, 13'). The angle and energy of the ion implantation are selected so that the implanted n-type dopants laterally straggle beyond the interfaces between the p-doped silicon-germanium alloy region 30 and the first and second silicon-containing material regions (13, 13'). The portion of the first silicon-containing material region 13 implanted with the n-type dopants is a silicon-containing source region 36, and the portion of the second silicon-containing material region 13' implanted with the n-type dopants is a silicon-containing drain region 36'. The portion of the p-doped silicon-germanium alloy region 30 adjacent to the silicon-containing source region 36 and implanted with the n-type dopants is a first silicon-germanium alloy source region 34, and the portion of the p-doped silicon-germanium alloy region 30 adjacent to the silicon-containing drain region 36' and implanted with the n-type dopants is a first silicon-germanium alloy drain region 34'. The portion of the first silicon-containing material region 13 not implanted with the n-type dopants is a first silicon-containing body region 3, and the portion of the second silicon-containing material region 13' not implanted with the n-type dopants is a second silicon-containing body region 3'. The first and second silicon-containing body regions (3, 3') can be intrinsic or p-doped.

Further, p-type dopants are implanted into the upper portions of the first and second germanium-containing material regions (14, 14'). The angle and energy of the ion implantation are selected so that the implanted p-type dopants laterally straggle beyond the interfaces between the n-doped silicon-germanium alloy region 40 and the first and second germanium-containing material regions (14, 14'). The portion of the first germanium-containing material region 14 implanted with the p-type dopants is a germanium-containing source region 46, and the portion of the second germanium-containing material region 14' implanted with the p-type dopants is a germanium-containing drain region 46'. The portion of the n-doped silicon-germanium alloy region 40 adjacent to the germanium-containing source region 46 and implanted with the p-type dopants is a second silicon-germanium alloy source region 44, and the portion of the n-doped silicon-germanium alloy region 40 adjacent to the germanium-containing drain region 46' and implanted with the p-type dopants is a second silicon-germanium alloy drain region 44'. The portion of the first germanium-containing material region 14 not implanted with the p-type dopants is a first germanium-containing body region 4, and the portion of the second germanium-containing material region 14' not implanted with the p-type dopants is a second germanium-containing body region 4'. The first and second germanium-containing body regions (4, 4') can be intrinsic or n-doped.

The processing steps of FIGS. 8 and 9 of the first embodiment can be subsequently employed to form a p-type field effect transistor (PFET) located on a silicon-germanium alloy layer (10, 30, 40) in a substrate 8 in the second device region 200 and an n-type field effect transistor (NFET) located on the silicon-germanium alloy layer (10, 30, 40) in the substrate 8 in the first device region 100.

The PFET is located in an n-doped portion of the silicon-germanium alloy layer, i.e., the n-doped silicon-germanium alloy region 40. The PFET includes a germanium-containing source region 46 and a germanium-containing drain region 46'. The NFET is located in a p-doped portion of the silicon-germanium alloy layer, i.e., the p-doped silicon-germanium alloy region 30. The NFET includes a silicon-containing source region 36 and a silicon-containing drain region 36'.

The silicon-germanium alloy layer (10, 30, 40), the n-doped source extension region 32 and the n-doped drain extension region 32', the p-doped source extension region 42 and the p-doped drain extension region 42', the first and second silicon-germanium alloy source regions (34, 44), and the first and second silicon-germanium alloy drain regions (34', 44') have the same silicon-to-germanium ratio, which is herein referred to as a first silicon-to-germanium ratio, that is greater than zero and less than infinity, i.e., is a finite positive number. The silicon-containing source region 36, the silicon-containing drain region 36', and the first and second silicon-containing body regions (3, 3') have the same silicon-to-germanium ratio, which is herein referred to as a second silicon-to-germanium ratio that is greater than zero and is greater than the first silicon-to-germanium ratio. The second silicon-to-germanium ratio can be infinity if germanium is not present in the silicon-containing source region 36, the silicon-containing drain region 36', and the first and second silicon-containing body regions (3, 3'). The germanium-containing source region 46, the germanium-containing drain region 46', and the first and second germanium-containing body regions (4, 4') have the same silicon-to-germanium ratio, which is herein referred to as a third silicon-to-germanium ratio, that is less than the first silicon-to-germanium ratio. The third silicon-to-germanium ratio can be zero if the germanium-containing source region 46, the germanium-containing drain region 46', and the first and second germanium-containing body regions (4, 4') do not include silicon.

The p-n junctions of the first variation of the first exemplary semiconductor structure do not coincide with material junctions at which the composition of semiconductor materials change. The silicon-containing source region 36, the silicon-containing drain region 36', and the first and second silicon-containing body regions (3, 3') apply a tensile stress to the channel of the NFET along the direction of the channel, i.e., along the direction connecting the silicon-containing source region 36 and the silicon-containing drain region 36' (the horizontal direction in FIG. 13). The channel of the NFET is located between the n-doped source extension region 32 and the n-doped drain extension region 32'. The tensile stress applied to the channel of the NFET along the direction of the channel enhances the mobility of electrons, thereby increasing the on-current of the NFET.

The germanium-containing source region 46, the germanium-containing drain region 46', and the first and second germanium-containing body regions (4, 4') apply a compressive stress to the channel of the PFET along the direction of the channel, i.e., along the direction connecting the germanium-containing source region 46 and the germanium-containing drain region 46' (the horizontal direction in FIG. 13). The channel of the PFET is located between the p-doped source extension region 42 and the p-doped drain extension region 42'. The compressive stress applied to the channel of the PFET along the direction of the channel enhances the mobility of holes, thereby increasing the on-current of the PFET.

Various metal-semiconductor alloy regions (93, 93', 94, 94', 95A, 95B), various stress-generating dielectric liners (80A, 80B), a middle-of-line (MOL) dielectric layer 98, and various contact via structures 99 employing the same processing steps as the processing steps of FIGS. 8 and 9. If a tensile-stress-generating dielectric liner 80A and/or a compressive-stress-generating dielectric liner 80B are formed, the tensile-stress-generating dielectric liner 80A applies additional tensile stress to the channel of the underlying NFET so that the mobility of electrons is further increased in the NFET and/or the compressive-stress-generating dielectric liner 80B applies additional compressive stress to the channel of the underlying PFET so that the mobility of holes is further increased in the PFET.

Figure 14:
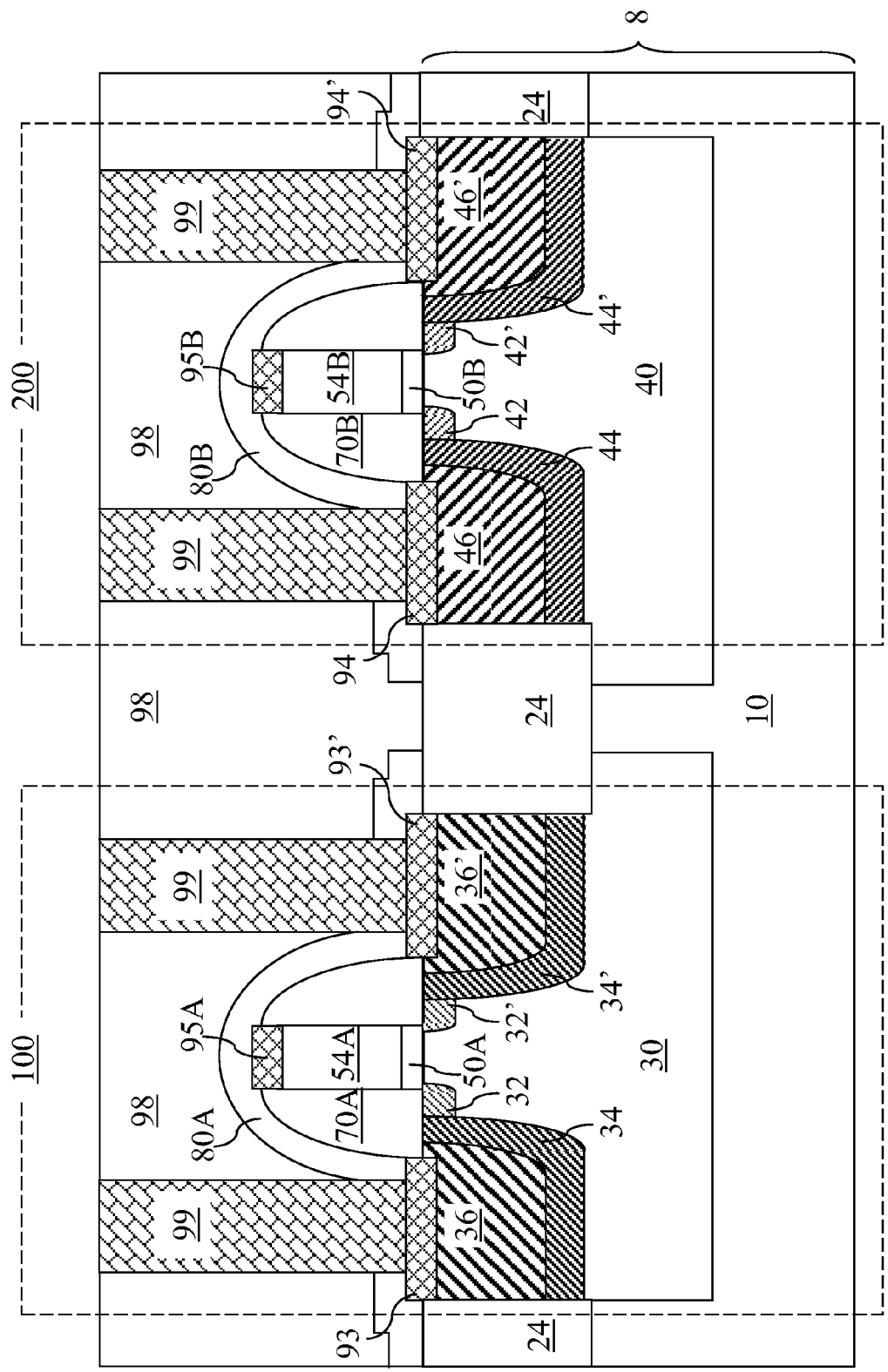
FIG. 14 is a vertical cross-sectional view of a second variation of the first exemplary semiconductor structure according to the first embodiment of the present disclosure.

Referring to FIG. 14, a second variation of the first exemplary semiconductor structure according to the first embodiment of the present disclosure can be derived from the first variation of the first exemplary semiconductor structure of FIG. 12 by removing the second dielectric masking layer 69 and implanting dopants into the first and second device regions (100, 200).

Specifically, n-type dopants are implanted into and through the first and second silicon-containing material regions (13, 13'). The angle and energy of the ion implantation are selected so that the implanted n-type dopants laterally and vertically straggle beyond the interfaces between the p-doped silicon-germanium alloy region 30 and the first and second silicon-containing material regions (13, 13'). The entirety of the first silicon-containing material region 13 is implanted with the n-type dopants, thereby forming a silicon-containing source region 36. The entirety of the second silicon-containing material region 13' is implanted with the n-type dopants, thereby forming a silicon-containing drain region 36'. The portion of the p-doped silicon-germanium alloy region 30 adjacent to a sidewall and a bottom surface of the silicon-containing source region 36 and implanted with the n-type dopants is a first silicon-germanium alloy source region 34, and the portion of the p-doped silicon-germanium alloy region 30 adjacent to a sidewall and a bottom surface of the silicon-containing drain region 36' and implanted with the n-type dopants is a first silicon-germanium alloy drain region 34'.

Further, p-type dopants are implanted into the upper portions of the first and second germanium-containing material regions (14, 14'). The angle and energy of the ion implantation are selected so that the implanted p-type dopants laterally and vertically straggle beyond the interfaces between the n-doped silicon-germanium alloy region 40 and the first and second germanium-containing material regions (14, 14'). The entirety of the first germanium-containing material region 14 is implanted with the p-type dopants, thereby forming a germanium-containing source region 46. The entirety of the second germanium-containing material region 14' is implanted with the p-type dopants, thereby forming a germanium-containing drain region 46'. The portion of the n-doped silicon-germanium alloy region 40 adjacent to a sidewall and a bottom surface of the germanium-containing source region 46 and implanted with the p-type dopants is a second germanium-containing alloy source region 44, and the portion of the n-doped silicon-germanium alloy region 40 adjacent to a sidewall and a bottom surface of the germanium-containing drain region 46' and implanted with the p-type dopants is a second silicon-germanium alloy drain region 44'.

The processing steps of FIGS. 8 and 9 of the first embodiment can be subsequently employed to form a p-type field effect transistor (PFET) located on a silicon-germanium alloy layer (10, 30, 40) in a substrate 8 in the second device region 200 and an n-type field effect transistor (NFET) located on the silicon-germanium alloy layer (10, 30, 40) in the substrate 8 in the first device region 100.

The PFET is located in an n-doped portion of the silicon-germanium alloy layer, i.e., the n-doped silicon-germanium alloy region 40. The PFET includes a germanium-containing source region 46 and a germanium-containing drain region 46'. The NFET is located in a p-doped portion of the silicon-germanium alloy layer, i.e., the p-doped silicon-germanium alloy region 30. The NFET includes a silicon-containing source region 36 and a silicon-containing drain region 36'.

The silicon-germanium alloy layer (10, 30, 40), the n-doped source extension region 32 and the n-doped drain extension region 32', the p-doped source extension region 42 and the p-doped drain extension region 42', the first and second silicon-germanium alloy source regions (34, 44), and the first and second silicon-germanium alloy drain regions (34', 44') have the same silicon-to-germanium ratio, which is herein referred to as a first silicon-to-germanium ratio, that is greater than zero and less than infinity, i.e., is a finite positive number. The silicon-containing source region 36 and the silicon-containing drain region 36' have the same silicon-to-germanium ratio, which is herein referred to as a second silicon-to-germanium ratio that is greater than zero and is greater than the first silicon-to-germanium ratio. The second silicon-to-germanium ratio can be infinity if germanium is not present in the silicon-containing source region 36 and the silicon-containing drain region 36'. The germanium-containing source region 46 and the germanium-containing drain region 46' have the same silicon-to-germanium ratio, which is herein referred to as a third silicon-to-germanium ratio, that is less than the first silicon-to-germanium ratio. The third silicon-to-germanium ratio can be zero if the germanium-containing source region 46 and the germanium-containing drain region 46' do not include silicon.

The p-n junctions of the first variation of the first exemplary semiconductor structure do not coincide with material junctions at which the composition of semiconductor materials change. The silicon-containing source region 36 and the silicon-containing drain region 36' apply a tensile stress to the channel of the NFET along the direction of the channel, i.e., along the direction connecting the silicon-containing source region 36 and the silicon-containing drain region 36' (the horizontal direction in FIG. 14). The channel of the NFET is located between the n-doped source extension region 32 and the n-doped drain extension region 32'. The tensile stress applied to the channel of the NFET along the direction of the channel enhances the mobility of electrons, thereby increasing the on-current of the NFET.

The germanium-containing source region 46 and the germanium-containing drain region 46' apply a compressive stress to the channel of the PFET along the direction of the channel, i.e., along the direction connecting the germanium-containing source region 46 and the germanium-containing drain region 46' (the horizontal direction in FIG. 14). The channel of the PFET is located between the p-doped source extension region 42 and the p-doped drain extension region 42'. The compressive stress applied to the channel of the PFET along the direction of the channel enhances the mobility of holes, thereby increasing the on-current of the PFET.

Various metal-semiconductor alloy regions (93, 93', 94, 94', 95A, 95B), various stress-generating dielectric liners (80A, 80B), a middle-of-line (MOL) dielectric layer 98, and various contact via structures 99 employing the same processing steps as the processing steps of FIGS. 8 and 9. If a tensile-stress-generating dielectric liner 80A and/or a compressive-stress-generating dielectric liner 80B are formed, the tensile-stress-generating dielectric liner 80A applies additional tensile stress to the channel of the underlying NFET so that the mobility of electrons is further increased in the NFET and/or the compressive-stress-generating dielectric liner 80B applies additional compressive stress to the channel of the underlying PFET so that the mobility of holes is further increased in the PFET.

Figure 15:
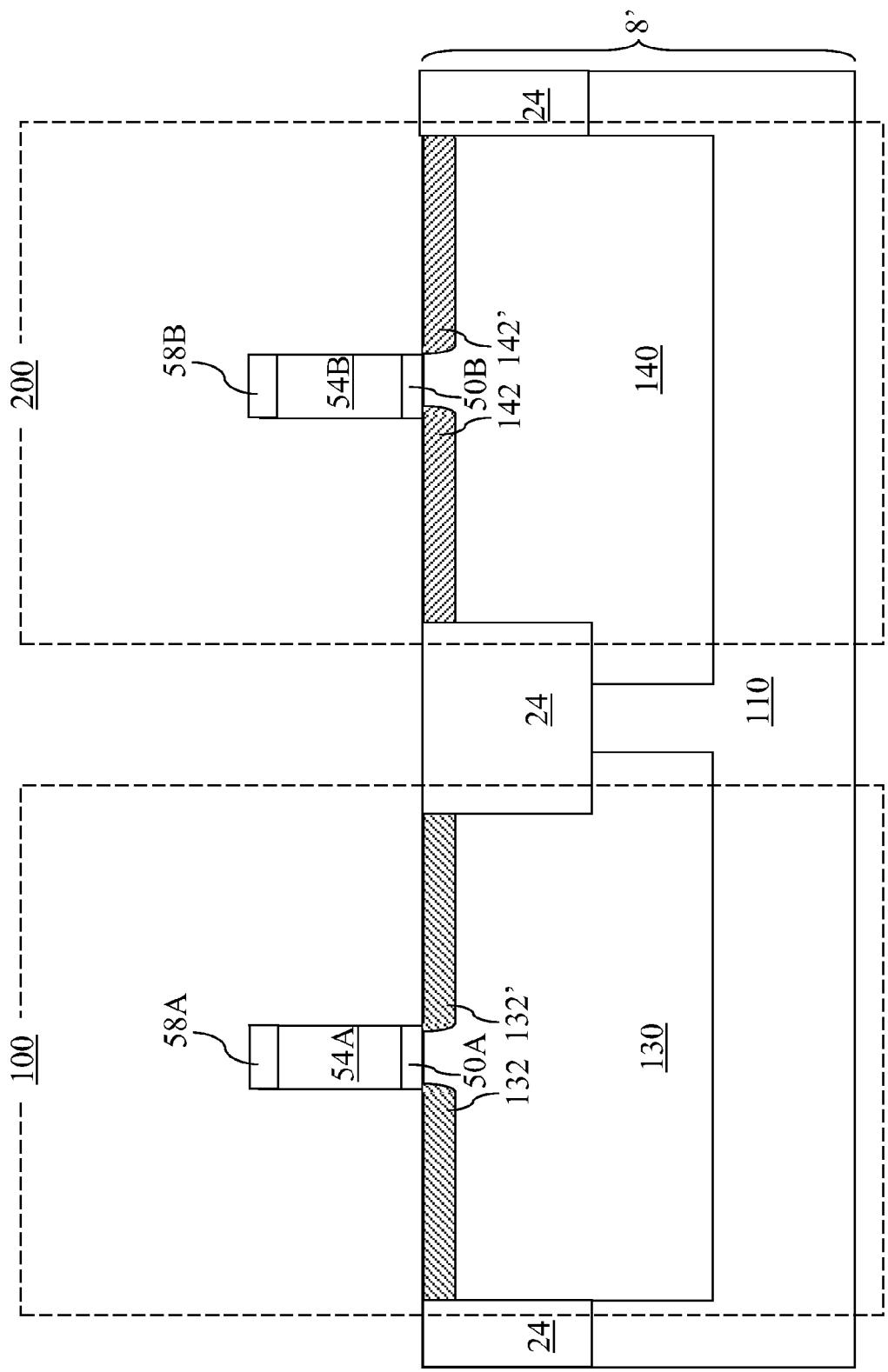
FIGS. 15-21 are sequential vertical cross-sectional views of a second exemplary semiconductor structure according to a second embodiment of the present disclosure at various stages of a manufacturing process.

Referring to FIG. 15, a second exemplary semiconductor structure according to a second embodiment of the present disclosure includes a substrate 8'. The substrate 8' includes a germanium layer, which can include an underlying germanium layer 110, a p-doped germanium region 130 that is an n-doped portion of the germanium layer, and an n-doped germanium region 140 that is an n-doped portion of the germanium layer. The p-doped germanium region 130 can function as a p-type well, and the n-doped germanium region 140 can function as an n-type well. The underlying germanium layer 10 may be intrinsic, p-doped, or n-doped. The germanium layer (110, 130, 140) can consist of germanium if undoped, or can consist of germanium and p-type or n-type dopants.

The substrate 8' may be a bulk substrate including the germanium layer (110, 130, 140) at the top portion thereof. Alternately, the substrate 8' can be a semiconductor-on-insulator (SOI) substrate that includes a buried insulator layer (not shown). In this case, the germanium layer of the SOI substrate can include a p-doped germanium region 130 and an n-doped germanium region 140 that are located direction on a top surface of the buried insulator layer.

The p-doped germanium region 130 and the n-doped germanium region 140 are single crystalline. In one embodiment, the entirety of the germanium layer (110, 130, 140) can be single crystalline with epitaxial alignment of atoms throughout. If the substrate 8' is a bulk substrate, the entirety of the substrate 8' can be single crystalline with epitaxial alignment of atoms throughout. If the substrate 8' is an SOI substrate, the entirety of the top semiconductor layer above the buried insulator layer can be a germanium layer, which can be single crystalline and having epitaxial alignment of atoms throughout.

At least one shallow trench isolation structure 24 can be formed on the top surface of the substrate 8'. For example, shallow trenches can be formed by lithographic patterning and anisotropic etching. The shallow trenches can be filled with a dielectric material, which is subsequently planarized to remove excess portions above the top surface of the substrate 8'. The remaining portions of the dielectric material constitute the at least one shallow trench isolation structure 24, which is typically located between the p-doped germanium region 130 and the n-doped germanium region 140.

A gate dielectric layer, a gate electrode layer, and a dielectric gate cap layer are sequentially deposited on the top surface of the substrate 8', and lithographically patterned to form a first gate stack (50A, 54A, 58A) and a second gate stack (50B, 54B, 58B) in the same manner as in the first embodiment.

An n-doped source extension region 132 and an n-doped drain extension region 132' can be formed in the first device region 100 by implanting n-type dopants in a masked ion implantation step. The dopant concentration in the n-doped source extension region 132 and the n-doped drain extension region 132' can be from $1.0\times10^{19}/cm^3$ to $5.0\times10^{20}/cm^3$, although lesser and greater dopant concentrations can also be employed. The n-doped source extension region 132 and the n-doped drain extension region 132' include n-doped germanium.

Likewise, a p-doped source extension region 142 and a p-doped drain extension region 142' can be formed in the second device region 200 by implanting p-type dopants in another masked ion implantation step. The dopant concentration in the p-doped source extension region 142 and the p-doped drain extension region 142' can be from $1.0\times10^{19}/cm^3$ to $5.0\times10^{20}/cm^3$, although lesser and greater dopant concentrations can also be employed. The p-doped source extension region 142 and the p-doped drain extension region 142' include p-doped germanium.

Figure 16:
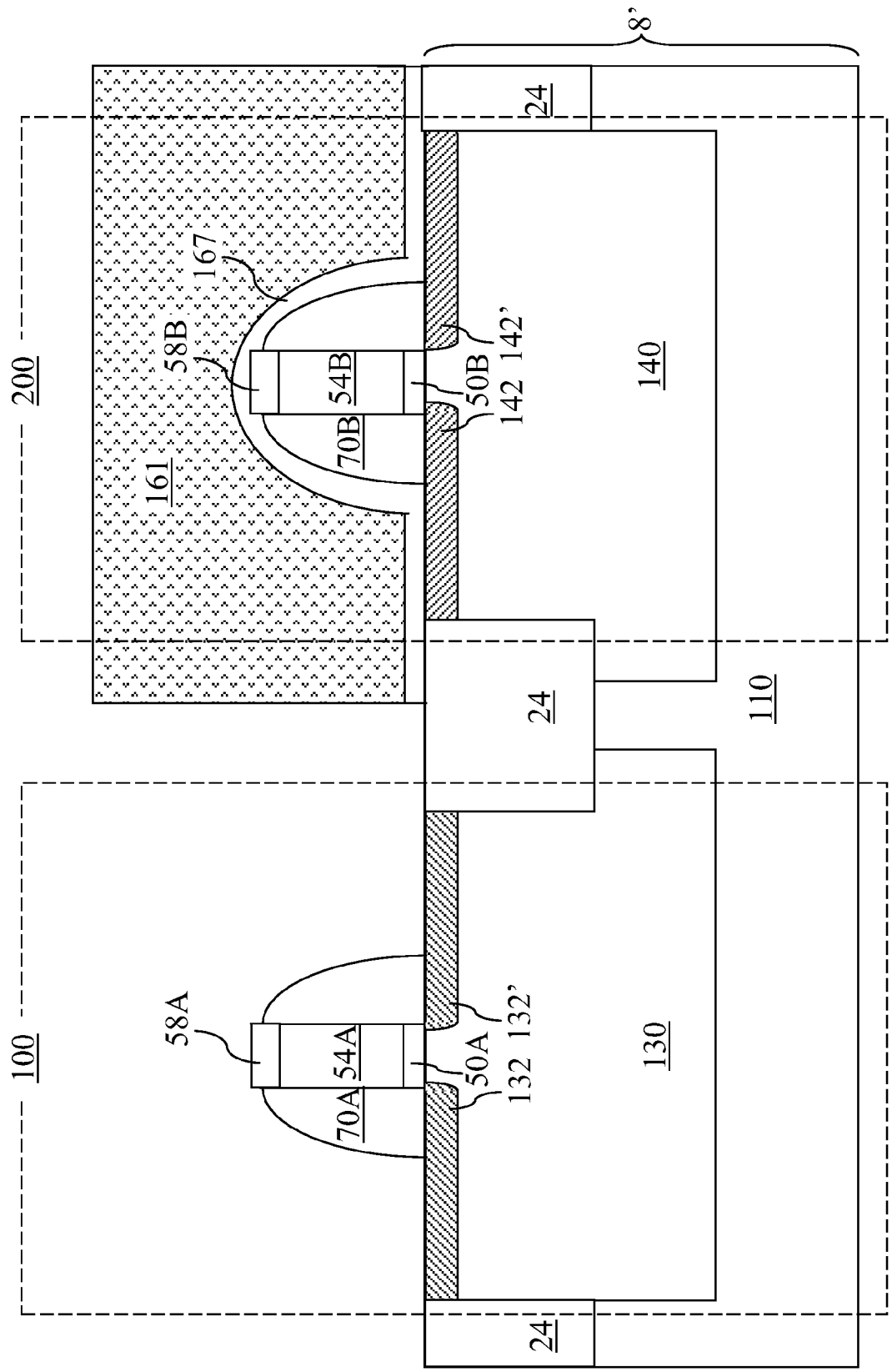

Referring to FIG. 16, a first gate spacer 70A and a second gate spacer 70B are formed by deposition of a dielectric material, for example, by chemical vapor deposition, followed by an anisotropic ion etch. The dielectric material can be, for example, silicon oxide, silicon nitride, or a combination thereof. Each of the first and second gate spacers (70A, 70B) can be composed of a single dielectric material, or can include a plurality of dielectric materials in multiple layers.

A dielectric masking layer 167 is deposited over the top surfaces of the first and second dielectric gate caps (58A, 58B), the first and second gate spacers (70A, 70B), and the exposed surfaces of the substrate 8'. The dielectric masking layer 167 includes a dielectric material, which is preferably different from the dielectric materials of the first and second gate caps (58A, 58B) and the outer surfaces of the first and second gate spacers (70A, 70B). For example, the dielectric material of the first and second gate caps (58A, 58B) and the outer surfaces of the first and second gate spacers (70A, 70B) can include silicon oxide, and the dielectric material of the dielectric masking layer 167 can be silicon nitride.

A photoresist layer 161 is applied over the top surface of the dielectric masking layer 167 and is lithographically patterned to expose the portion of the dielectric masking layer 167 in the first device region 100, while covering the portion of the dielectric masking layer 167 in the second device region 200. An etch is employed to remove the portion of the dielectric masking layer 167 in the first device region 100 selective to the first gate spacer 70A and the first dielectric gate cap 58A. The etch can be an anisotropic etch. The photoresist layer 161 may be removed at this step or at a subsequent step.

Figure 17:
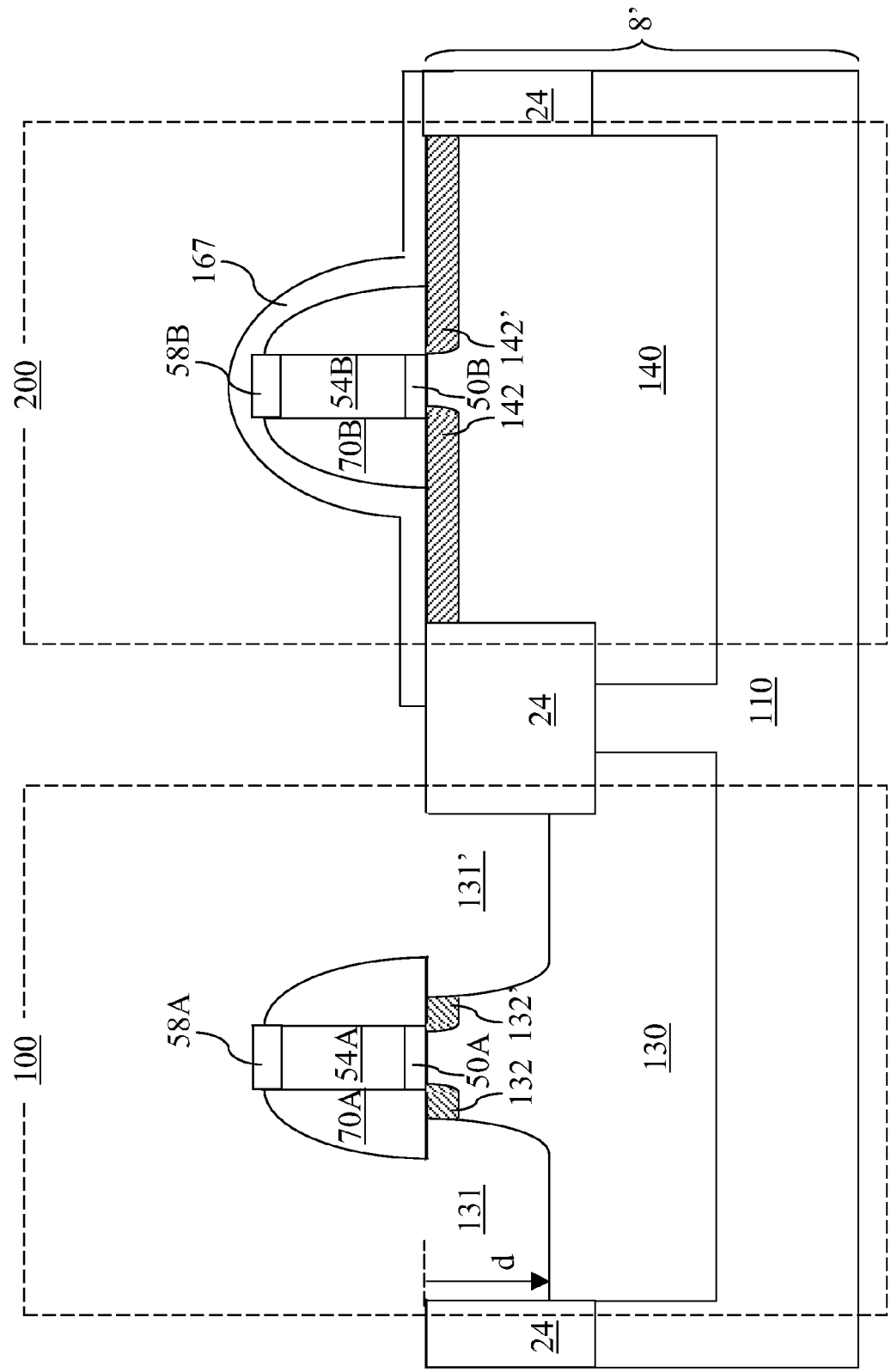

Referring to FIG. 17, an anisotropic etch is performed to recess exposed portions of the silicon-germanium alloy material in the first device region 100 employing the combination of the dielectric masking layer 167, the at least one shallow trench isolation structure 24, the first gate spacer 70A, and the first dielectric gate cap 58A as an etch mask. If the photoresist layer 161 is present, the photoresist layer 161 is employed as a part of the etch mask instead of the dielectric masking layer 167. A source-side trench 131 and a first drain-side trench are formed in the first device region 100. The source-side trench 131 and the drain-side trench 131' has a planar horizontal bottom surface located at a depth d, which is less than the thickness of the at least one shallow trench isolation structure 24, i.e., the vertical distance between a top surface and a bottom surface of one of the at least one shallow trench isolation structure 24. If still present, the photoresist layer 161 is removed at this step.

Figure 18:
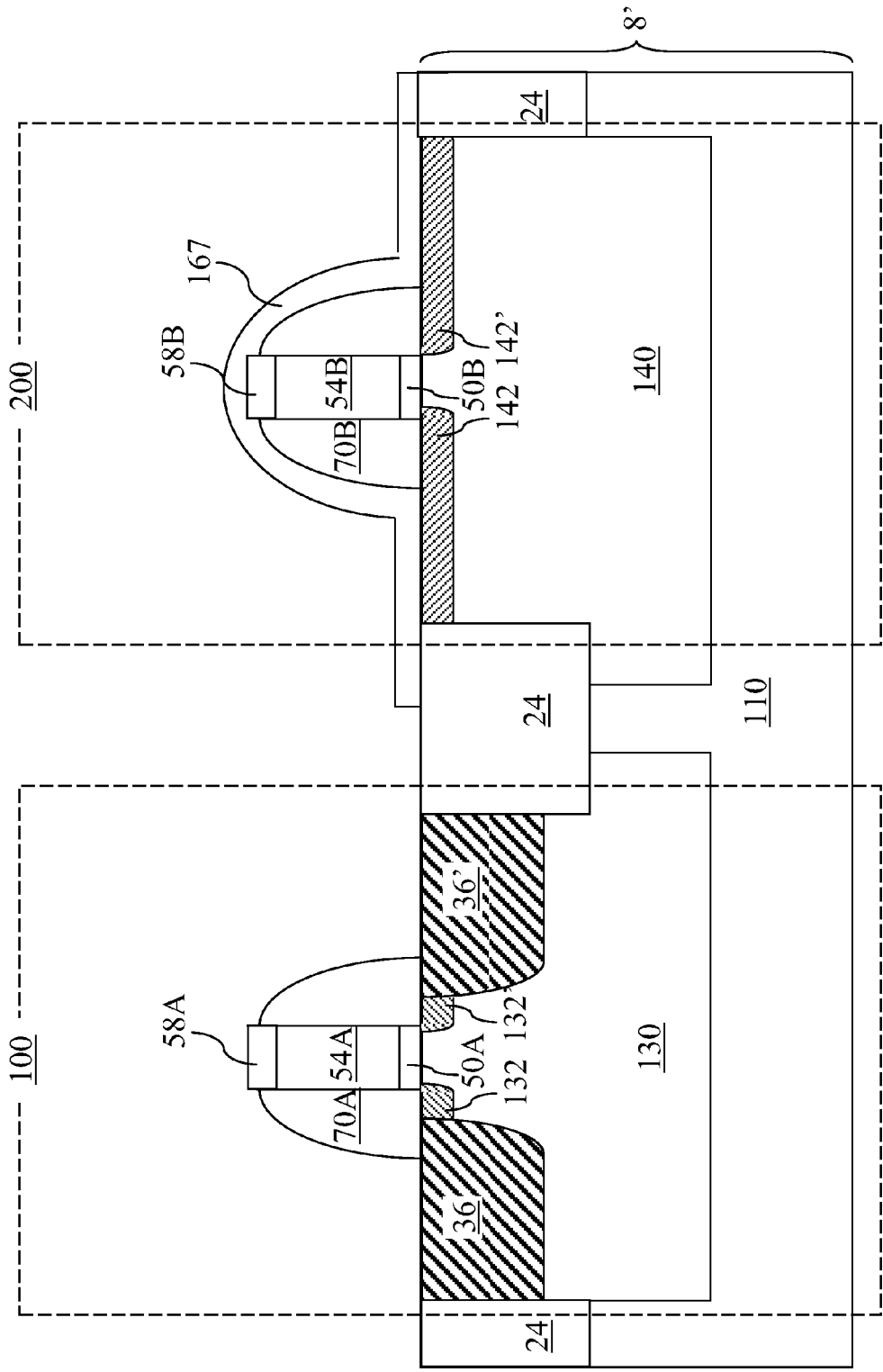

Referring to FIG. 18, an n-doped silicon-containing material is deposited by selective epitaxy to fill the source-side trench 131 and the drain-side trench 131'. The n-doped silicon-containing material deposited in the source-side trench 131 forms a silicon-containing source region 36, and the n-doped silicon-containing material deposited in the drain-side trench 131' forms a silicon-containing drain region 36'. The top surfaces of the silicon-containing source region 36 and the silicon-containing drain region 36' can be coplanar with, located above, or located below, the interface between the p-doped germanium region 130 and the first gate dielectric 50A.

The n-doped silicon-containing material includes silicon and at least one n-type dopant such as P, As, and Sb. The n-doped silicon-containing material can be n-doped silicon, or can be an n-doped silicon-germanium alloy. In other words, the n-doped silicon-containing material may, or may not, include germanium. In case the n-doped silicon-containing material does not include germanium, the silicon-containing source region 36 and the silicon-containing drain region 36' can consist of silicon and at least one n-type dopant. In case the n-doped silicon-containing material includes germanium, the silicon-containing source region 36 and the silicon-containing drain region 36' can include an alloy of silicon, germanium, and at least one n-type dopant. In this case, the silicon-to-germanium ratio of the silicon containing material of the silicon-containing source region 36 and the silicon-containing drain region 36' is non-zero. In contrast, the silicon-to-germanium ratio of the germanium layer (110, 130, 140) is zero.

The selective epitaxy process deposits the silicon-containing material only on exposed semiconductor surfaces, which are the exposed surfaces of the p-doped germanium region 130, the n-doped source extension region 132, and the n-doped drain extension region 132'. The selective epitaxy process proceeds on semiconductor surfaces selective to dielectric surfaces so that the silicon-containing material is not deposited on dielectric surfaces. The selective epitaxy process can employ at least one reactant including silicon, at least one dopant gas, and at least one etchant. For example, the at least one reactant gas can include silane, disilane, dichlorosilane, trichlorosilane, and silicon tetrachloride. If the silicon-containing material includes germanium, the at least one reactant gas can also include germane, digermane, dichlorogermane, and germane tetrachloride. The at least one dopant gas can be phosphine, arsine, and/or stibine. The selective epitaxy process employs in-situ doping, i.e., the dopants are incorporated into the deposited material during deposition. The at least one etchant can be hydrogen chloride gas. Because the deposition rate of the silicon-containing material on semiconductor surfaces is greater than the nucleation rate of the silicon-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate. The dielectric masking layer 167 is subsequently removed selective to the dielectric materials of the first and second dielectric gate caps (58A, 58B), the first and second gate spacers (70A, 70B), and the semiconductor materials in the substrate 8'.

The process conditions for the selective epitaxy process can be selected to facilitate epitaxial alignment of atoms between a single crystalline silicon-germanium alloy of the p-doped germanium region 130 and the silicon-containing source region 36 and the silicon-containing drain region 36'. In this case, the entirety of the p-doped germanium region 130, the silicon-containing source region 36, and the silicon-containing drain region 36' can be single crystalline with epitaxial atomic alignment throughout. The dielectric masking layer 167 is subsequently removed, for example, by a wet etch.

Figure 19:
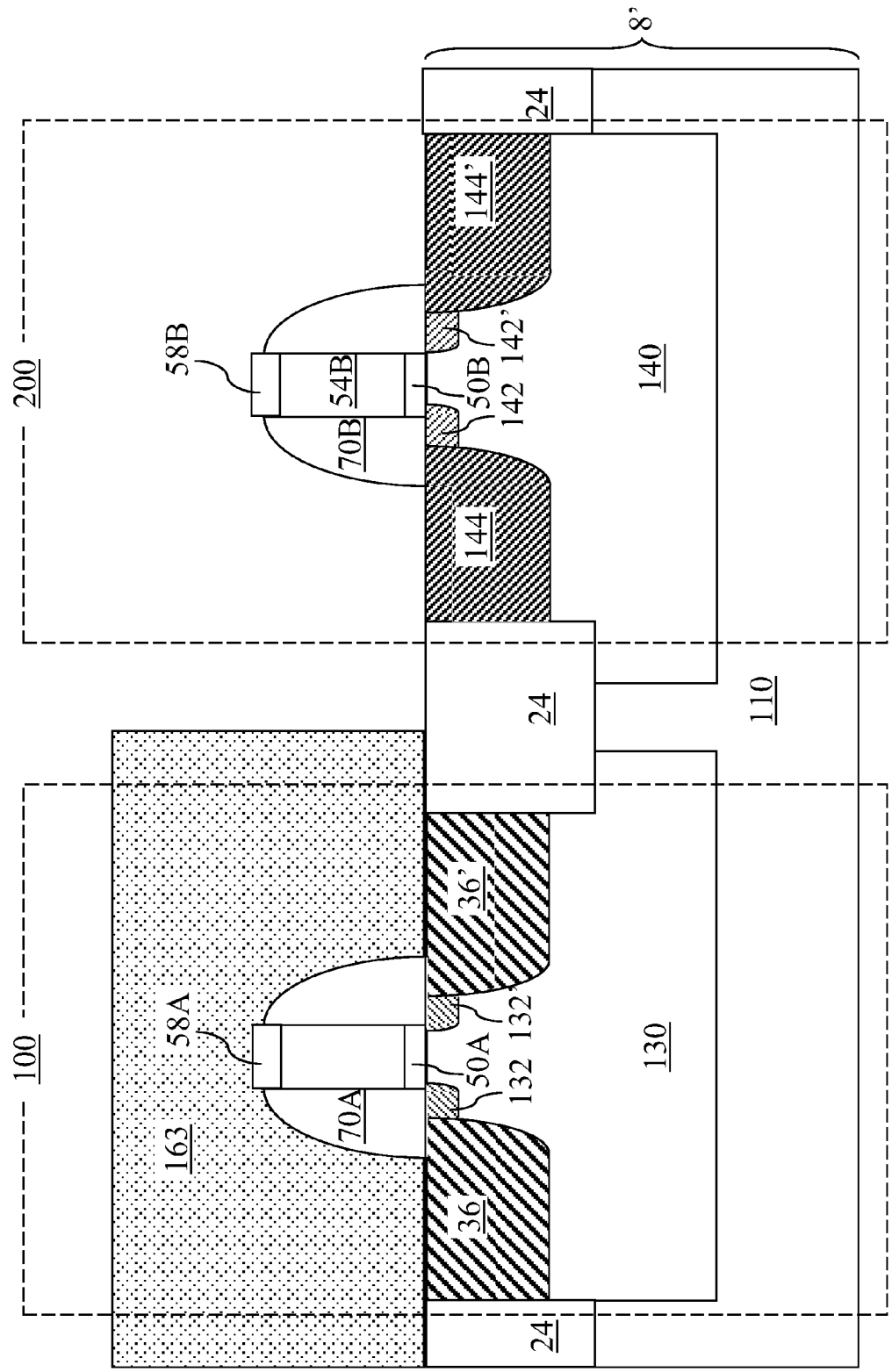

Referring to FIG. 19, a photoresist layer 163 is applied to the top surface of the second exemplary semiconductor structure and lithographically patterned to cover the first gate stack (50A, 54A, 58A), the first gate spacer 70A, the silicon-containing source region 36, and the silicon-containing drain region 36', while exposing the area of the second device region 200. P-type dopants having a greater atomic radius than germanium are implanted into exposed upper portions of the n-doped germanium region 140. A p-type dopant can be a Group IIIA element having an atomic radius greater than the atomic radius of germanium. The atomic radius of germanium is 0.152 nm. The Group IIIA elements having an atomic radius greater than the atomic radius of germanium include Al, Ga, In, and Tl. Al has an atomic radius of 0.182 nm, Ga has an atomic radius of 0.181 nm, In has an atomic radius of 0.200 nm, and Tl has an atomic radius of 0.208 nm. Preferably, the p-type dopants are selected from Ga, In, and Tl, which do not behave as a metallic element within a semiconductor material. The portions of the n-doped germanium region 140 that are implanted with at least one Group IIIA element becomes p-doped regions because the density of the implanted Group IIIA element exceeds the density of pre-existing n-type dopants. The p-doped regions implanted with the at least one Group IIIA element are herein referred to as a p-doped source region 144 and a p-doped drain region 144'.

Figure 20:
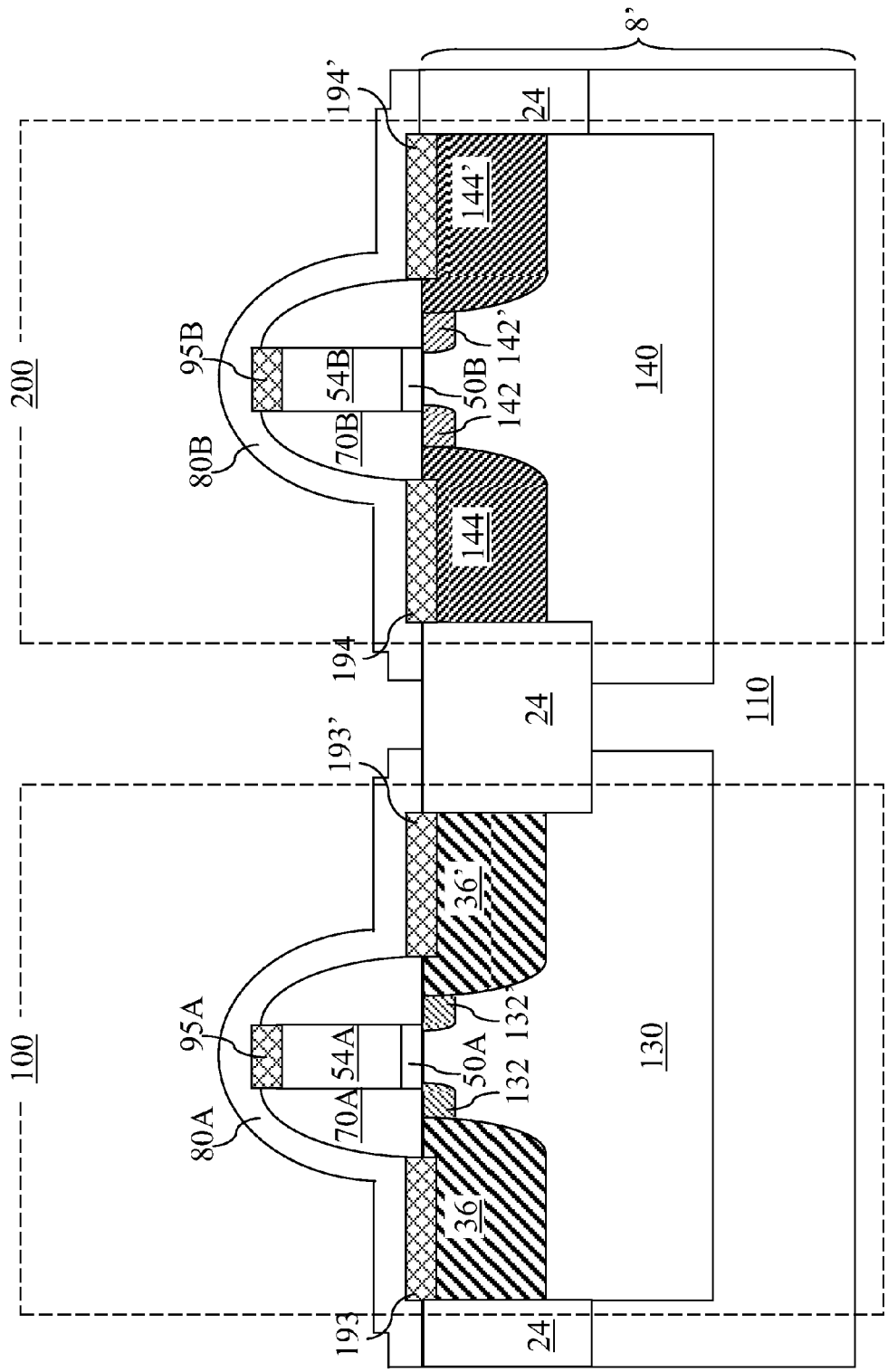

Referring to FIG. 20, the photoresist layer 163 is removed, for example, by ashing. The second exemplary semiconductor structure includes a p-type field effect transistor (PFET) located on a germanium layer (110, 130, 140) in a substrate 8' in the second device region 200. The PFET is located in an n-doped portion of the germanium layer, i.e., the n-doped germanium region 140. The PFET includes a p-doped source region 144 and a p-doped drain region 144', which include at least one Group IIIA element having an atomic radius greater than the atomic radius of germanium. The p-doped source region 144 and the p-doped drain region 144' have the same composition.

Further, the second exemplary semiconductor structure includes an n-type field effect transistor (NFET) located on the germanium layer (110, 130, 140) in the substrate 8' in the first device region 100. The NFET is located in a p-doped portion of the germanium layer, i.e., the p-doped germanium region 130. The NFET includes a silicon-containing source region 36 and a silicon-containing drain region 36'. The silicon-containing source region 36 and the silicon-containing drain region 36' have the same composition.

The p-n junctions between the germanium layer (110, 130, 140) and each of the silicon-containing source region 36, the silicon-containing drain region 36', the p-doped source region 144, and the p-doped drain region 144' coincide with material junctions at which the composition of materials change. Specifically, a first interface between the p-doped source region 144 and the n-doped portion of the germanium layer (110, 130, 140), i.e., the n-doped germanium region 140, is a p-n junction. A second interface between the p-doped drain region 144' and the n-doped portion of the germanium layer (110, 130, 140) is another p-n junction. A third interface between the silicon-containing source region 36 and the p-doped portion of the germanium layer, i.e., the p-doped germanium region 130, is yet another p-n junction. A fourth interface between the silicon-containing drain region 36' and the p-doped portion of the germanium layer (110, 130, 140) is still another p-n junction.

Because silicon atoms are smaller than germanium atoms and epitaxial alignment with the p-doped germanium region 130 causes the lattice constant of the silicon-containing source region 36 and the silicon-containing drain region 36' to be nearly identical to the lattice constant of germanium, the silicon-containing source region 36 and the silicon-containing drain region 36' apply a tensile stress to the channel of the NFET along the direction of the channel, i.e., along the direction connecting the silicon-containing source region 36 and the silicon-containing drain region 36' (the horizontal direction in FIG. 7). The channel of the NFET is located between the n-doped source extension region 132 and the n-doped drain extension region 132'. The tensile stress applied to the channel of the NFET along the direction of the channel enhances the mobility of electrons, thereby increasing the on-current of the NFET.

Because the implanted Group IIIA atoms are larger than germanium atoms and epitaxial alignment with the n-doped germanium region 140 causes the lattice constant of the p-doped source region 144 and the p-doped drain region 144' to be nearly identical to the lattice constant of germanium, the p-doped source region 144 and the p-doped drain region 144' apply a compressive stress to the channel of the PFET along the direction of the channel, i.e., along the direction connecting the p-doped source region 144 and the p-doped drain region 144' (the horizontal direction in FIG. 7). The channel of the PFET is located between the p-doped source extension region 142 and the p-doped drain extension region 142'. The compressive stress applied to the channel of the PFET along the direction of the channel enhances the mobility of holes, thereby increasing the on-current of the PFET.

The first and second dielectric gate caps (58A, 58B) are removed, for example, by a wet etch or a dry etch. Various metal-semiconductor alloy regions (93, 93', 94, 94', 95A, 95B) can be formed employing the same processing steps as the processing steps of FIG. 8. Because the silicon-containing source region 36 and the silicon-containing drain region 36' have the same composition, the first source-side metal-semiconductor alloy region 93 and the first drain-side metal-semiconductor alloy region 93' have the same composition. Because the p-doped source region 144 and the p-doped drain region 144' have the same composition, the second source-side metal-semiconductor alloy region 94 and the second drain-side metal-semiconductor alloy region 94' have the same composition. Because the silicon-containing source region 36 and the silicon-containing drain region 36' include silicon, the first source-side metal-semiconductor alloy region 93 and the first drain-side metal-semiconductor alloy region 93' include a metal silicide. Because the p-doped source region 144 and the p-doped drain region 144' includes germanium, the second source-side metal-semiconductor alloy region 94 and the second drain-side metal-semiconductor alloy region 94' include a metal germanide. In case the silicon-containing source region 36 and the silicon-containing drain region 36' include silicon-germanium alloys, the first source-side metal-semiconductor alloy region 93 and the first drain-side metal-semiconductor alloy region include metal germano-silicides.

Further, various stress-generating dielectric liners (80A, 80B) can be formed employing the same processing steps as the processing steps of FIG. 8. If a tensile-stress-generating dielectric liner 80A and/or a compressive-stress-generating dielectric liner 80B are formed, the tensile-stress-generating dielectric liner 80A applies additional tensile stress to the channel of the underlying NFET so that the mobility of electrons is further increased in the NFET and/or the compressive-stress-generating dielectric liner 80B applies additional compressive stress to the channel of the underlying PFET so that the mobility of holes is further increased in the PFET.

Figure 21:
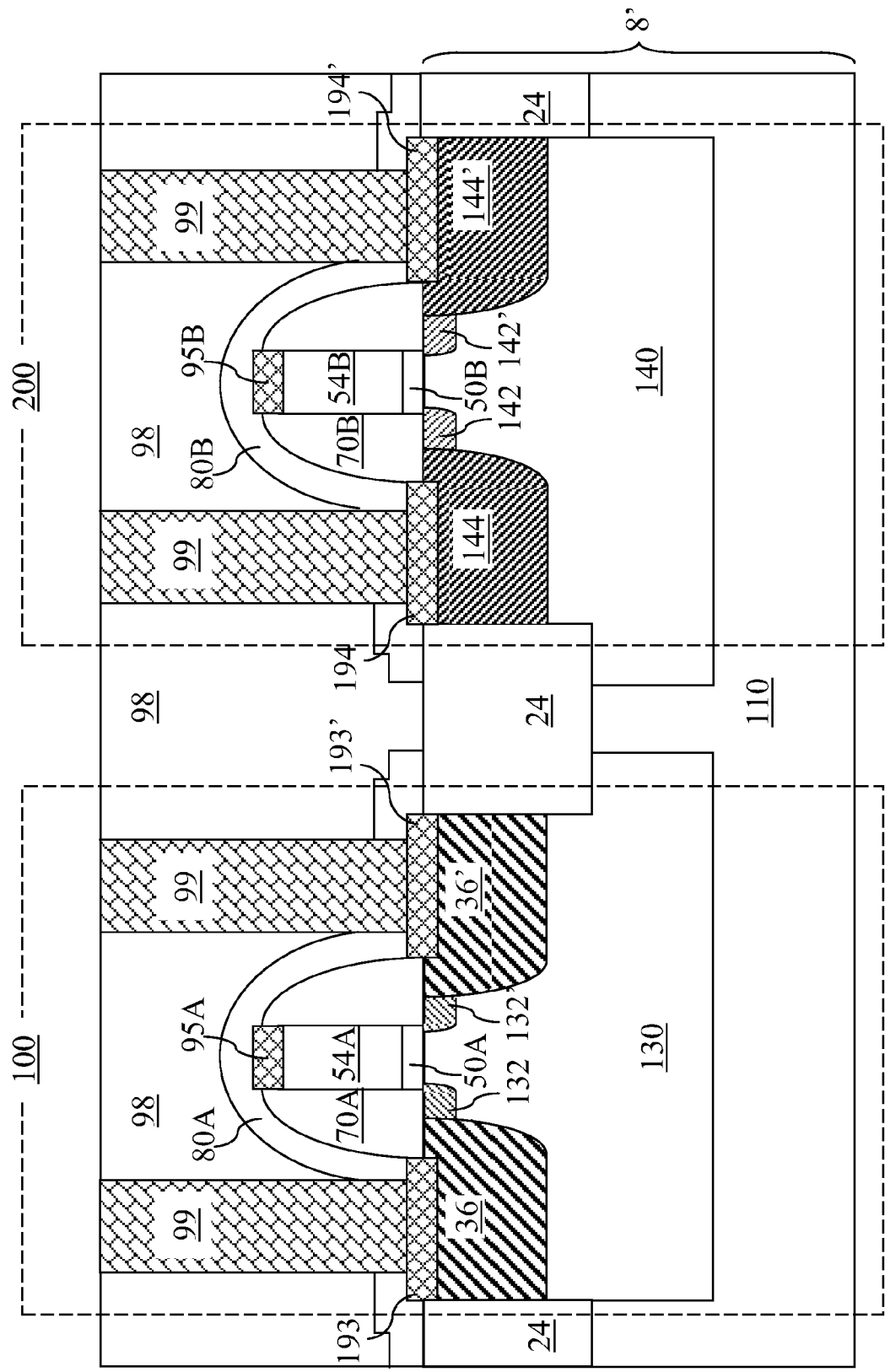

Referring to FIG. 21, a middle-of-line (MOL) dielectric layer 98 and various contact via structures 99 can be formed employing the same processing steps as the processing steps of FIG. 9. The second exemplary semiconductor structure includes a p-type field effect transistor (PFET) located on a germanium layer (110, 130, 140) in a substrate 8' in the second device region 200. The PFET is located in an n-doped portion of the germanium layer, i.e., the n-doped germanium region 140. The PFET includes a p-doped source region 144 and a p-doped drain region 144', which include at least one Group IIIA element having an atomic radius greater than the atomic radius of germanium and apply a compressive stress to the channel of the PFET. The p-doped source region 144 and the p-doped drain region 144' have the same composition. The NFET is located in a p-doped portion of the silicon-germanium alloy layer, i.e., the p-doped silicon-germanium alloy region 30. The NFET includes a silicon-containing source region 36 and a silicon-containing drain region 36', which apply a tensile stress to the channel of the NFET.

Figure 22:
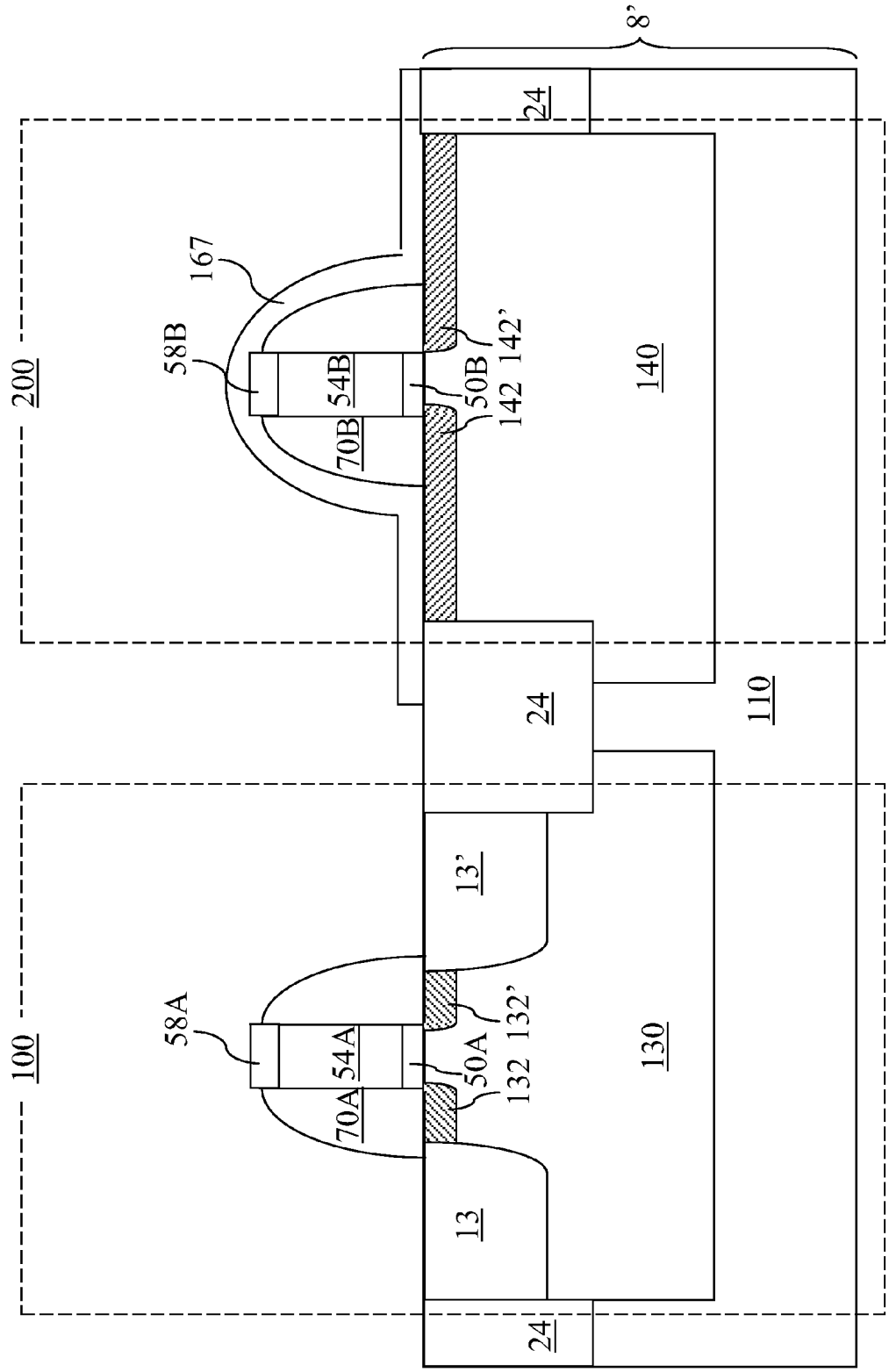
FIGS. 22-23 are sequential vertical cross-sectional views of a first variation of the second exemplary semiconductor structure according to the second embodiment of the present disclosure at various stages of a manufacturing process.

Referring to FIG. 22, a first variation of the second exemplary semiconductor structure according to the second embodiment of the present disclosure can be derived from the second exemplary semiconductor structure of FIG. 17 by depositing an undoped or p-doped silicon-containing material by selective epitaxy. Thus, the deposited semiconductor material is an undoped or p-doped silicon-containing material in the first variation compared with the n-doped silicon containing material in the second exemplary semiconductor structure of FIG. 18 in the second embodiment.

Specifically, the undoped or p-doped silicon-containing material is deposited by selective epitaxy to fill the source-side trench 131 and the drain-side trench 131'. The undoped or p-doped silicon-containing material deposited in the source-side trench 131 forms a first silicon-containing material region 13, and the undoped or p-doped silicon-containing material deposited in the drain-side trench 131' forms a second silicon-containing material region 13'. The top surfaces of the first silicon-containing material region 13 and the second silicon-containing material region 13' can be coplanar with, located above, or located below, the interface between the p-doped germanium region 130 and the first gate dielectric 50A.

The undoped or p-doped silicon-containing material may, or may not, include germanium. If the deposited material is an undoped silicon-containing material, the deposited material includes silicon and does not include any dopant. The undoped silicon-containing material can consist of silicon, or can be a silicon-germanium alloy having a lesser silicon-to-germanium ratio than the germanium layer (110, 130, 140). If the deposited material is a p-doped silicon-containing material, the deposited material includes silicon and at least one p-type dopant such as B. The concentration of p-type dopants in the first and second silicon-containing material regions (13, 13') is less than, or on the same order of magnitude as, the dopant concentration of the p-doped germanium region 130, and is typically less than $3.0 \times 10^{18}/cm^3$. The p-doped silicon-containing material can consist of p-doped silicon, or can be a p-doped silicon-germanium alloy. In case the undoped or p-doped silicon-containing material includes germanium, the first silicon-containing material region 13 and the second silicon-containing material region 13' can include an alloy of silicon, germanium, and optionally at least one p-type dopant. In this case, the silicon-to-germanium ratio of the silicon containing material of the first and second silicon-containing material regions (13, 13') is greater than the silicon-to-germanium ratio of the germanium layer (110, 130, 140).

The selective epitaxy process deposits the silicon-containing material only on exposed semiconductor surfaces, which are the exposed surfaces of the p-doped germanium region 130, the n-doped source extension region 132, and the n-doped drain extension region 132'. The selective epitaxy process proceeds on semiconductor surfaces selective to dielectric surfaces so that the silicon-containing material is not deposited on dielectric surfaces. The selective epitaxy process can employ at least one reactant including silicon, at least one dopant gas, and at least one etchant. For example, the at least one reactant gas can include silane, disilane, dichlorosilane, trichlorosilane, and silicon tetrachloride. If the silicon-containing material includes germanium, the at least one reactant gas can also include germane, digermane, dichlorogermane, and germane tetrachloride. The at least one dopant gas can be diborane if the first and second silicon-containing material regions (13, 13') are p-doped. The at least one etchant can be hydrogen chloride gas. Because the deposition rate of the silicon-containing material on semiconductor surfaces is greater than the nucleation rate of the silicon-containing material on dielectric surfaces, the flow rate of the at least one etchant can be set so that the etch rate is between the deposition rate on semiconductor surfaces and the nucleation rate on dielectric surfaces. The net deposition rate on the semiconductor surfaces is the deposition rate less the etch rate. The dielectric masking layer 167 is subsequently removed selective to the dielectric materials of the first and second dielectric gate caps (58A, 58B), the first and second gate spacers (70A, 70B), and the semiconductor materials in the substrate 8'.

The process conditions for the selective epitaxy process can be selected to facilitate epitaxial alignment of atoms between a single crystalline silicon-germanium alloy of the p-doped germanium region 130 and the first and second silicon-containing material regions (13, 13'). In this case, the entirety of the p-doped germanium region 130, the first silicon-containing material region 13, and the second silicon-containing material region 13' can be single crystalline with epitaxial atomic alignment throughout. The dielectric masking layer 167 is subsequently removed, for example, by a wet etch.

Figure 23:
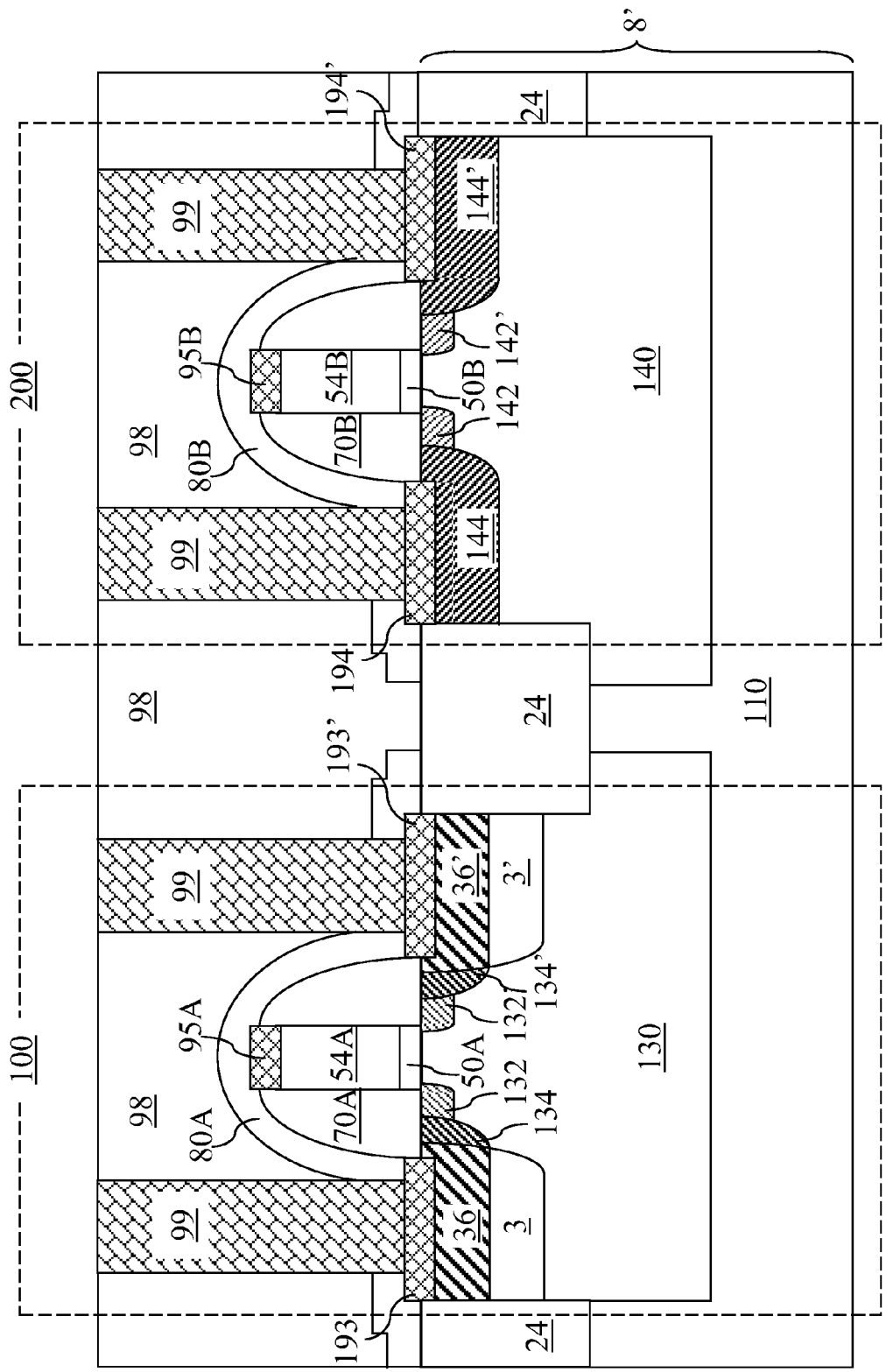

Referring to FIG. 23, n-type dopants are implanted into the upper portions of the first and second silicon-containing material regions (13, 13'). The angle and energy of the ion implantation are selected so that the implanted n-type dopants laterally straggle beyond the interfaces between the p-doped germanium region 130 and the first and second silicon-containing material regions (13, 13'). The portion of the first silicon-containing material region 13 implanted with the n-type dopants is a silicon-containing source region 36, and the portion of the second silicon-containing material region 13' implanted with the n-type dopants is a silicon-containing drain region 36'. The portion of the p-doped germanium region 130 adjacent to the silicon-containing source region 36 and implanted with the n-type dopants is an n-doped germanium source region 134, and the portion of the p-doped germanium region 130 adjacent to the silicon-containing drain region 36' and implanted with the n-type dopants is an n-doped germanium drain region 134'. The portion of the first silicon-containing material region 13 not implanted with the n-type dopants is a first silicon-containing body region 3, and the portion of the second silicon-containing material region 13' not implanted with the n-type dopants is a second silicon-containing body region 3'. The first and second silicon-containing body regions (3, 3') can be intrinsic or p-doped.

Further, p-type dopants having a greater atomic radius than germanium are implanted into exposed upper portions of the n-doped germanium region 140. A p-type dopant can be a Group IIIA element having an atomic radius greater than the atomic radius of germanium. Preferably, the p-type dopants are selected from Ga, In, and Tl, which do not behave as a metallic element within a semiconductor material. The portions of the n-doped germanium region 140 that are implanted with at least one Group IIIA element becomes p-doped regions because the density of the implanted Group IIIA element exceeds the density of pre-existing n-type dopants. The p-doped regions implanted with the at least one Group IIIA element are herein referred to as a p-doped source region 144 and a p-doped drain region 144'.

The germanium layer (110, 130, 140), the n-doped source extension region 132 and the n-doped drain extension region 132', the p-doped source extension region 142 and the p-doped drain extension region 142', the n-doped germanium source region 134, the n-doped germanium drain region 134', the p-doped source region 144, and the p-doped drain region 144' do not include germanium, and consequently, have the same silicon-to-germanium ratio of zero. The silicon-containing source region 36, the silicon-containing drain region 36', and the first and second silicon-containing body regions (3, 3') have the same silicon-to-germanium ratio, which is herein referred to as a second silicon-to-germanium ratio that is greater than zero. The second silicon-to-germanium ratio can be infinity if germanium is not present in the silicon-containing source region 36, the silicon-containing drain region 36', and the first and second silicon-containing body regions (3, 3').

The first variation of the second exemplary semiconductor structure includes a p-type field effect transistor (PFET) located on a germanium layer (110, 130, 140) in a substrate 8' in the second device region 200. The p-n junctions of the first variation of the second exemplary semiconductor structure do not coincide with material junctions at which the composition of semiconductor materials change.

The silicon-containing source region 36, the silicon-containing drain region 36', and the first and second silicon-containing body regions (3, 3') apply a tensile stress to the channel of the NFET along the direction of the channel, i.e., along the direction connecting the silicon-containing source region 36 and the silicon-containing drain region 36' (the horizontal direction in FIG. 23). The channel of the NFET is located between the n-doped source extension region 132 and the n-doped drain extension region 132'. The tensile stress applied to the channel of the NFET along the direction of the channel enhances the mobility of electrons, thereby increasing the on-current of the NFET.

The p-doped source region 144 and the p-doped drain region 144' apply a compressive stress to the channel of the PFET along the direction of the channel, i.e., along the direction connecting the p-doped source region 144 and the p-doped drain region 144' (the horizontal direction in FIG. 23). The channel of the PFET is located between the p-doped source extension region 142 and the p-doped drain extension region 142'. The compressive stress applied to the channel of the PFET along the direction of the channel enhances the mobility of holes, thereby increasing the on-current of the PFET.

Various metal-semiconductor alloy regions (93, 93', 94, 94', 95A, 95B), various stress-generating dielectric liners (80A, 80B), a middle-of-line (MOL) dielectric layer 98, and various contact via structures 99 employing the same processing steps as the processing steps of FIGS. 8 and 9. If a tensile-stress-generating dielectric liner 80A and/or a compressive-stress-generating dielectric liner 80B are formed, the tensile-stress-generating dielectric liner 80A applies additional tensile stress to the channel of the underlying NFET so that the mobility of electrons is further increased in the NFET and/or the compressive-stress-generating dielectric liner 80B applies additional compressive stress to the channel of the underlying PFET so that the mobility of holes is further increased in the PFET.

Figure 24:
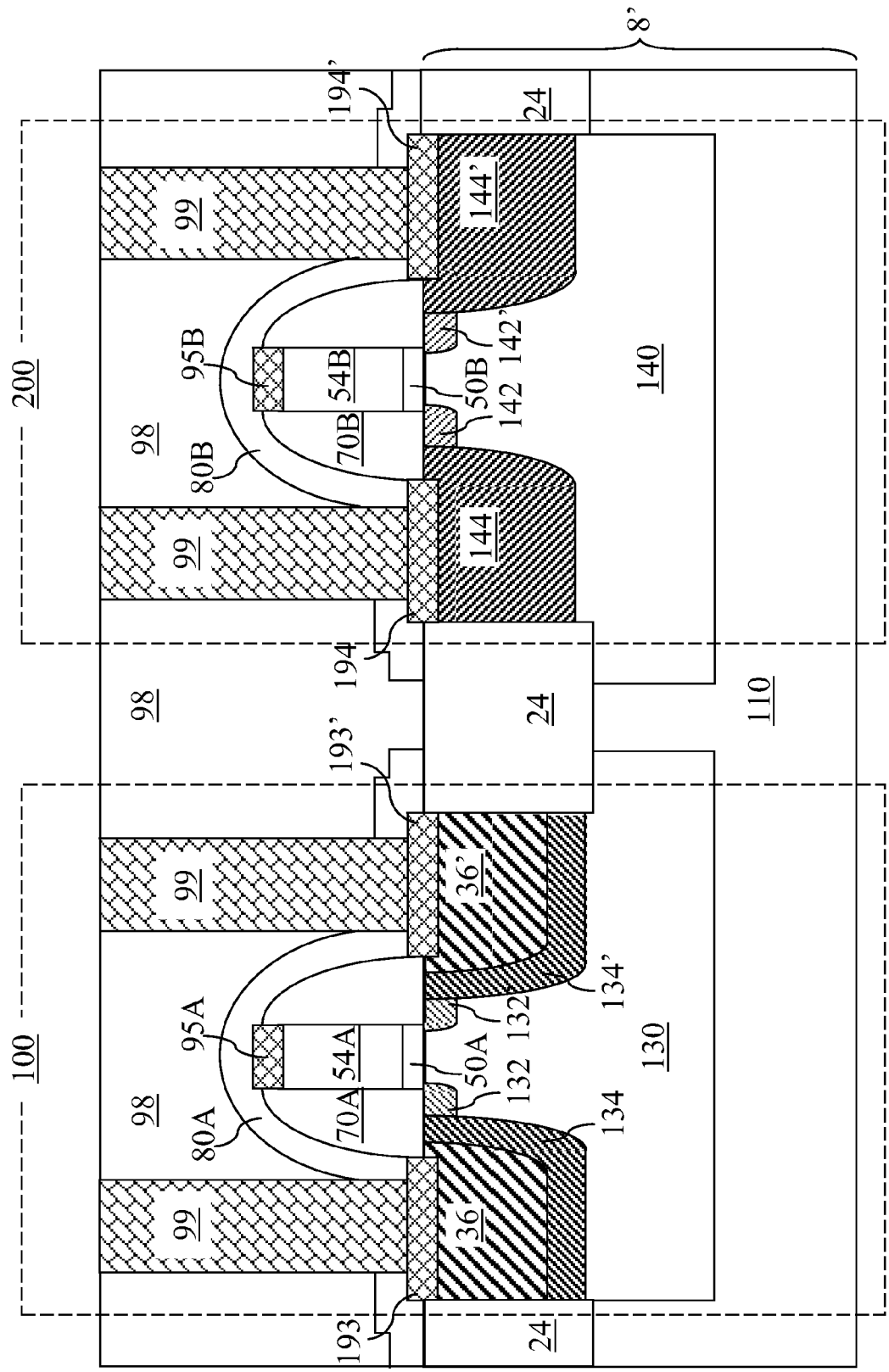
FIG. 24 is a vertical cross-sectional view of a second variation of the second exemplary semiconductor structure according to the second embodiment of the present disclosure.

Referring to FIG. 24, a second variation of the second exemplary semiconductor structure according to the first embodiment of the present disclosure can be derived from the first variation of the second exemplary semiconductor structure of FIG. 22 by removing the second dielectric masking layer 69 and implanting dopants into the first and second device regions (100, 200).

Specifically, n-type dopants are implanted into and through the first and second silicon-containing material regions (13, 13'). The angle and energy of the ion implantation are selected so that the implanted n-type dopants laterally and vertically straggle beyond the interfaces between the p-doped germanium region 130 and the first and second silicon-containing material regions (13, 13'). The entirety of the first silicon-containing material region 13 is implanted with the n-type dopants, thereby forming a silicon-containing source region 36. The entirety of the second silicon-containing material region 13' is implanted with the n-type dopants, thereby forming a silicon-containing drain region 36'. The portion of the p-doped germanium region 130 adjacent to a sidewall and a bottom surface of the silicon-containing source region 36 and implanted with the n-type dopants is a n-doped germanium source region 134, and the portion of the p-doped germanium region 130 adjacent to a sidewall and a bottom surface of the silicon-containing drain region 36' and implanted with the n-type dopants is a n-doped germanium drain region 134'.

Further, p-type dopants having a greater atomic radius than germanium are implanted into exposed upper portions of the n-doped germanium region 140. A p-type dopant can be a Group IIIA element having an atomic radius greater than the atomic radius of germanium. Preferably, the p-type dopants are selected from Ga, In, and Tl, which do not behave as a metallic element within a semiconductor material. The portions of the n-doped germanium region 140 that are implanted with at least one Group IIIA element becomes p-doped regions because the density of the implanted Group IIIA element exceeds the density of pre-existing n-type dopants. The p-doped regions implanted with the at least one Group IIIA element are herein referred to as a p-doped source region 144 and a p-doped drain region 144'.

The processing steps of FIGS. 8 and 9 of the first embodiment can be subsequently employed to form a p-type field effect transistor (PFET) located on a germanium layer (110, 130, 140) in a substrate 8' in the second device region 200 and an n-type field effect transistor (NFET) located on the germanium layer (110, 130, 140) in the substrate 8' in the first device region 100.

The PFET is located in an n-doped portion of the germanium layer, i.e., the n-doped germanium region 140. The PFET includes a p-doped source region 144 and a p-doped drain region 144'. The NFET is located in a p-doped portion of the germanium layer, i.e., the p-doped germanium region 130. The NFET includes a silicon-containing source region 36, a silicon-containing drain region 36', an n-doped germanium source region 134, and an n-doped germanium drain region 134'.

The germanium layer (110, 130, 140), the n-doped source extension region 132 and the n-doped drain extension region 132', the p-doped source extension region 142 and the p-doped drain extension region 142', the n-doped germanium source region 134, the n-doped germanium drain region 134', the p-doped source region 144, and the p-doped drain region 144' do not include silicon, and consequently, have the same silicon-to-germanium ratio of zero. The silicon-containing source region 36 and the silicon-containing drain region 36' have the same silicon-to-germanium ratio, which is can be a positive number or infinity.

The p-n junctions of the first variation of the second exemplary semiconductor structure do not coincide with material junctions at which the composition of semiconductor materials change. The silicon-containing source region 36 and the silicon-containing drain region 36' apply a tensile stress to the channel of the NFET along the direction of the channel, i.e., along the direction connecting the silicon-containing source region 36 and the silicon-containing drain region 36' (the horizontal direction in FIG. 24). The channel of the NFET is located between the n-doped source extension region 132 and the n-doped drain extension region 132'. The tensile stress applied to the channel of the NFET along the direction of the channel enhances the mobility of electrons, thereby increasing the on-current of the NFET.

The p-doped source region 144 and the p-doped drain region 144' apply a compressive stress to the channel of the PFET along the direction of the channel, i.e., along the direction connecting the p-doped source region 144 and the p-doped drain region 144' (the horizontal direction in FIG. 14). The channel of the PFET is located between the p-doped source extension region 142 and the p-doped drain extension region 142'. The compressive stress applied to the channel of the PFET along the direction of the channel enhances the mobility of holes, thereby increasing the on-current of the PFET.

Various metal-semiconductor alloy regions (93, 93', 94, 94', 95A, 95B), various stress-generating dielectric liners (80A, 80B), a middle-of-line (MOL) dielectric layer 98, and various contact via structures 99 employing the same processing steps as the processing steps of FIGS. 8 and 9. If a tensile-stress-generating dielectric liner 80A and/or a compressive-stress-generating dielectric liner 80B are formed, the tensile-stress-generating dielectric liner 80A applies additional tensile stress to the channel of the underlying NFET so that the mobility of electrons is further increased in the NFET and/or the compressive-stress-generating dielectric liner 80B applies additional compressive stress to the channel of the underlying PFET so that the mobility of holes is further increased in the PFET.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a p-type field effect transistor (PFET) located above a silicon-germanium alloy layer in a substrate and including a germanium-containing source region, a germanium-containing drain region and an n-doped silicon-germanium alloy region having a same atomic ratio of germanium atoms to silicon atoms as said silicon-germanium alloy layer, wherein said silicon-germanium alloy layer includes silicon at a greater atomic concentration than said germanium-containing source region and said germanium-containing drain region, and said n-doped silicon-germanium alloy region contacts a surface of a gate dielectric of said PFET; and
an n-type field effect transistor (NFET) located above said silicon-germanium alloy layer in said substrate and including a silicon-containing source region, a silicon-containing drain region and a p-doped silicon-germanium alloy region having a same atomic ratio of germanium atoms to silicon atoms as said silicon-germanium alloy layer, wherein said silicon-germanium alloy layer includes germanium at a greater atomic concentration than said silicon-containing source region and said silicon-containing drain region, and said p-doped silicon-germanium alloy region contacts a surface of a gate dielectric of said NFET.

2. The semiconductor structure of claim 1, wherein said n-doped silicon-germanium alloy region and said p-doped silicon-germanium alloy region are located directly on said silicon-germanium alloy layer.

3. The semiconductor structure of claim 1, wherein an interface between said germanium-containing source region and said n-doped silicon-germanium alloy region is a p-n junction, an interface between said germanium-containing drain region and said n-doped silicon-germanium alloy region is another p-n junction, an interface between said silicon-containing source region and said p-doped silicon-germanium alloy region is yet another p-n junction, and an interface between said silicon-containing drain region and said p-doped silicon-germanium alloy region is still another p-n junction.

4. The semiconductor structure of claim 1, further comprising:
a first germanium-containing body region contacting said n-doped silicon-germanium alloy region and contacting said germanium-containing source region; and
a second germanium-containing body region contacting said n-doped silicon-germanium alloy region and contacting said germanium-containing drain region.

5. The semiconductor structure of claim 4, wherein said first and second germanium-containing body regions have a same atomic ratio of germanium atoms to silicon atoms as said germanium-containing source region and said germanium-containing drain region.

6. The semiconductor structure of claim 1, further comprising:
a first silicon-containing body region contacting said p-doped silicon-germanium alloy region and contacting said silicon-containing source region; and
a second silicon-containing body region contacting said p-doped silicon-germanium alloy region and contacting said silicon-containing drain region.

7. The semiconductor structure of claim 6, wherein said first and second silicon-containing body regions have a same atomic ratio of silicon atoms to germanium atoms as said silicon-containing source region and said silicon-containing drain region.

8. The semiconductor structure of claim 1, further comprising:
a silicon-germanium alloy source region contacting said germanium-containing source region; and
a silicon-germanium alloy drain region contacting said germanium-containing drain region, wherein said silicon-germanium alloy source region and said silicon-germanium alloy drain region have a same atomic ratio of germanium atoms to silicon atoms as said silicon-germanium alloy layer.

9. The semiconductor structure of claim 8, wherein an atomic concentration of n-type dopants is continuous across said silicon-germanium alloy source region and said germanium-containing source region and across said silicon-germanium alloy drain region and said germanium-containing drain region.

10. The semiconductor structure of claim 8, further comprising:
another silicon-germanium alloy source region contacting said silicon-containing source region; and
another silicon-germanium alloy drain region contacting said silicon-containing drain region, wherein said another silicon-germanium alloy source region and said another silicon-germanium alloy drain region have a same atomic ratio of germanium atoms to silicon atoms as said silicon-germanium alloy layer.

11. The semiconductor structure of claim 1, wherein said germanium-containing source region and said germanium-containing drain region includes an alloy of silicon, germanium, and at least one p-type dopant, and said silicon-containing source region and said silicon-containing drain region includes an alloy of silicon, germanium, and at least one n-type dopant.

12. The semiconductor structure of claim 1, wherein said germanium-containing source region and said germanium-containing drain region consists of germanium and at least one n-type dopant, and said silicon-containing source region and said silicon-containing drain region consists of silicon and at least one p-type dopant.

13. A semiconductor structure comprising:
a p-type field effect transistor (PFET) located over a germanium layer in a substrate, said PFET comprising an n-doped germanium region, a p-doped source region, and a p-doped drain region, wherein each of said n-doped germanium region, said p-doped source region and said p-doped drain region includes germanium and does not include silicon, and each of said p-doped source region and said p-doped drain region is doped with a Group IIIA element having an atomic radius greater than an atomic radius of germanium, wherein said n-doped germanium region contacts a surface of a gate dielectric of said PFET; and
an n-type field effect transistor (NFET) located over said germanium layer in said substrate, said PFET comprising a p-doped germanium region including germanium and not including silicon, a silicon-containing source region, and a silicon-containing drain region, wherein said p-doped germanium region contacts a surface of a gate dielectric of said NFET.

14. The semiconductor structure of claim 13, wherein an interface between said silicon-containing source region and a p-doped portion of said germanium layer is a p-n junction, and an interface between said silicon-containing drain region and said p-doped portion of said germanium layer is another p-n junction.

15. The semiconductor structure of claim 13, further comprising:
a first silicon-containing body region embedded in said germanium layer and contacting said silicon-containing source region; and
a second silicon-containing body region embedded in said germanium alloy layer and contacting said silicon-containing drain region.

16. The semiconductor structure of claim 15, wherein said first and second silicon-containing body regions have a same atomic ratio of silicon atoms to germanium atoms as said silicon-containing source region and said silicon-containing drain region.

17. The semiconductor structure of claim 13, further comprising:
a germanium source region contacting said silicon-containing source region; and
a germanium drain region contacting said silicon-containing drain region, wherein said germanium source region and said germanium drain region do not include silicon.

18. The semiconductor structure of claim 17, wherein an atomic concentration of n-type dopants is continuous across said germanium source region and said silicon-containing source region and across said germanium drain region and said silicon-containing drain region.

19. The semiconductor structure of claim 13, wherein said silicon-containing source region and said silicon-containing drain region includes an alloy of silicon, germanium, and at least one n-type dopant.

20. A method of forming a semiconductor structure comprising:
forming a first gate dielectric directly on an n-doped silicon-germanium alloy region overlying a silicon-germanium alloy layer in a substrate;
forming a second gate dielectric directly on a p-doped silicon-germanium alloy region overlying said silicon-germanium alloy layer;
forming a germanium-containing source region and a germanium-containing drain region in said n-doped silicon-germanium alloy region, wherein said silicon-germanium alloy layer includes silicon at a greater atomic concentration than said germanium-containing source region and said germanium-containing drain region; and
forming a silicon-containing source region and a silicon-containing drain region in said p-doped silicon-germanium alloy region, wherein said silicon-germanium alloy layer includes germanium at a greater atomic concentration than said silicon-containing source region and said silicon-containing drain region.

21. The method of claim 20, wherein said germanium-containing source region and said germanium-containing drain region are formed by a selective epitaxy process that fills two trenches in said n-doped portion of said silicon-germanium alloy layer, and said silicon-containing source region and said silicon-containing drain region are formed by another selective epitaxy process that fills two trenches in said p-doped portion of said silicon-germanium alloy layer.

22. The method of claim 20, wherein said germanium-containing source region and said germanium-containing drain region are formed by implantation of at least one p-type dopant into said n-doped portion of said silicon-germanium alloy layer, and said silicon-containing source region and said silicon-containing drain region are formed by implantation of at least one n-type dopant into said p-doped portion of said silicon-germanium alloy layer.

23. A method of forming a semiconductor structure comprising:
forming a first gate dielectric directly on an n-doped germanium region that overlies a germanium alloy layer in a substrate;
forming a second gate dielectric directly on a p-doped germanium region that overlies said germanium layer;
forming a p-doped source region and a p-doped drain region that include germanium, do not include silicon, and are doped with a Group IIIA element having an atomic radius greater than an atomic radius of germanium in said n-doped germanium region; and
forming a silicon-containing source region and a silicon-containing drain region in said p-doped germanium region.

24. The method of claim 23, wherein said silicon-containing source region and said silicon-containing drain region are formed by a selective epitaxy process that fills two trenches in said p-doped portion of said germanium layer.

25. The method of claim 23, wherein said silicon-containing source region and said silicon-containing drain region are formed by implantation of at least one n-type dopant into said p-doped portion of said germanium layer.

* * * * *